(12) United States Patent
Shimomura et al.

(10) Patent No.: US 10,068,946 B2
(45) Date of Patent: Sep. 4, 2018

(54) MAGNETIC MEMORY

(71) Applicant: Kabushiki Kaisha Toshiba, Minato-ku (JP)

(72) Inventors: Naoharu Shimomura, Meguro (JP); Hiroaki Yoda, Kawasaki (JP); Tadaomi Daibou, Yokohama (JP); Yuuzo Kamiguchi, Yokohama (JP); Yuichi Ohsawa, Yokohama (JP); Tomoaki Inokuchi, Yokohama (JP); Satoshi Shirotori, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 26 days.

(21) Appl. No.: 15/264,111

(22) Filed: Sep. 13, 2016

(65) Prior Publication Data

US 2017/0077177 A1    Mar. 16, 2017

(30) Foreign Application Priority Data

Sep. 16, 2015    (JP) ................................ 2015-183351

(51) Int. Cl.
*H01L 27/22*    (2006.01)
*H01L 43/02*    (2006.01)
(Continued)

(52) U.S. Cl.
CPC .......... *H01L 27/228* (2013.01); *G11C 11/161* (2013.01); *G11C 11/1659* (2013.01);
(Continued)

(58) Field of Classification Search
CPC ........ H01L 27/228; H01L 43/02; G11C 11/18
See application file for complete search history.

(56) References Cited

U.S. PATENT DOCUMENTS 8,009,466 B2    8/2011   Sakimura et al.
8,159,872 B2    4/2012   Fukami et al.
(Continued)

FOREIGN PATENT DOCUMENTS

JP    2009-158554 A   7/2009
JP     2010-3850 A    1/2010
(Continued)

OTHER PUBLICATIONS

Office Action dated Jul. 6, 2016 in Japanese Patent Application No. 2015-183351 (with English translation).
(Continued)

*Primary Examiner* — Su C Kim
*Assistant Examiner* — David S Wilbert
(74) *Attorney, Agent, or Firm* — Oblon, McClelland, Maier & Neustadt, L.L.P.

(57) ABSTRACT

A magnetic memory of an embodiment includes: a first nonmagnetic layer including a first and second faces; a first and second wirings disposed on a side of the first face; a third wiring disposed on a side of the second face; a first transistor, one of the source and the drain being connected to the first wiring, the other one being connected to the first nonmagnetic layer; a second transistor, one of source and drain being connected to the second wiring, the other one being connected to the first nonmagnetic layer; a magnetoresistive element disposed between the first nonmagnetic layer and the third wiring, a first terminal of the magnetoresistive element being connected to the first nonmagnetic layer; and a third transistor, one of source and drain of the third transistor being connected to the second terminal, the other one being connected to the third wiring.

26 Claims, 31 Drawing Sheets

(51) Int. Cl.
*G11C 11/16* (2006.01)
*G11C 11/18* (2006.01)

(52) U.S. Cl.
CPC ...... *G11C 11/1673* (2013.01); *G11C 11/1675* (2013.01); *G11C 11/18* (2013.01); *H01L 43/02* (2013.01)

(56) References Cited

U.S. PATENT DOCUMENTS

| | | | |
|---|---|---|---|
| 8,295,006 | B2 | 10/2012 | Sugano et al. |
| 8,879,307 | B2 | 11/2014 | Kitagawa et al. |
| 8,897,061 | B2 | 11/2014 | Ezaki |
| 8,902,644 | B2 | 12/2014 | Sakimura et al. |
| 8,963,222 | B2 | 2/2015 | Guo |
| 2004/0262635 | A1* | 12/2004 | Lee ............... B82Y 10/00 257/199 |
| 2010/0109660 | A1* | 5/2010 | Wang ............... G01R 33/098 324/244 |
| 2014/0056060 | A1 | 2/2014 | Khvalkovskiy et al. |
| 2014/0169088 | A1 | 6/2014 | Buhrman et al. |

FOREIGN PATENT DOCUMENTS

| | | |
|---|---|---|
| JP | 2013-30685 A | 2/2013 |
| JP | 2013-243336 A | 12/2013 |
| JP | 2014-45196 A | 3/2014 |
| WO | WO 2008/102650 A1 | 8/2008 |
| WO | WO 2009/104427 A1 | 8/2009 |
| WO | WO 2011/037143 A1 | 3/2011 |
| WO | WO 2012/081453 A1 | 6/2012 |

OTHER PUBLICATIONS

Luqiao Liu, et al., "Spin-Torque Switching with the Giant Spin Hall Effect of Tantalum", Science, vol. 336, 2012, pp. 555-558 and Cover Page.

* cited by examiner

MAGNETIC MEMORY

CROSS REFERENCE TO RELATED APPLICATIONS

This application is based upon and claims the benefit of priority from prior Japanese Patent Application No. 2015-183351 filed on Sep. 16, 2015 in Japan, the entire contents of which are incorporated herein by reference.

FIELD

Embodiments described herein relate generally to magnetic memories.

BACKGROUND

A magnetic memory (hereinafter also referred to as a magnetoresistive random access memory (MRAM)) is a nonvolatile memory capable of high-speed operation. Therefore, MRAMs are expected to serve as novel nonvolatile work memories, and are being developed. In an MRAM, a magnetic tunnel junction (MTJ) element is used as the storage element. This MTJ element includes a first magnetic layer, a second magnetic layer, and a nonmagnetic insulating layer disposed between the first magnetic layer and the second magnetic layer. One of the first and second magnetic layers has a fixed magnetization direction and is also called the reference layer, and the other one of the first and second magnetic layers has a changeable magnetization direction and is also called the storage layer. The electrical resistance of this MTJ element is low when the magnetization directions of the reference layer and the storage layer are parallel to each other, and is high when the magnetization directions are antiparallel to each other.

In an MRAM, information "0" corresponds to one of a state where the magnetization directions of the reference layer and the storage layer are parallel to each other and a state where the magnetization directions are antiparallel to each other, and information "1" corresponds to the other one of the states. It is possible to determine whether the magnetization directions of the reference layer and the storage layer are parallel or whether the magnetization directions are antiparallel, using a magnetoresistive effect.

Writing into the MTJ element is performed by switching the magnetization direction of the storage layer. One of the known techniques for such writing is spin transfer torque magnetization switching (hereinafter also referred to as spin transfer torque (STT)). Writing by this STT is performed by applying current between the reference layer and the storage layer via the nonmagnetic insulating layer, and therefore, the nonmagnetic insulating layer might be broken at a time of writing. Current is also applied to the MTJ element at a time of information (data) reading. Therefore, read disturb might occur, as the magnetization direction of the storage layer is reversed by STT when data is read out.

Another one of the known techniques for writing is a technique using a spin Hall effect or a spin-orbit interaction (spin-orbit coupling). A spin-orbit interaction is a phenomenon in which current is applied to a nonmagnetic layer so that electrons having spin angular momenta (hereinafter also referred to simply as the spin) of the opposite orientations from each other are scattered in the opposite directions, and a spin current Is is generated. At this point, the spin s, the spin current Is, and the electron current Ie (of the opposite direction from the current) satisfy the relationship:

$Is \propto s \times Ie$ That is, the spin current Is is proportional to the outer product of the spin s and the electron current Ie. As an MTJ element is stacked on the nonmagnetic layer, spin orbit torque (SOT) is applied to the storage layer of the MTJ element by virtue of the spin current generated in the nonmagnetic layer, and the magnetization direction of the storage layer can be reversed. As the polarity (direction) of the current flowing in the nonmagnetic layer is reversed, the spin orbit torque (SOT) being applied to the storage layer of the MTJ element is also reversed. That is, the magnetization direction of the storage layer can be switched to a direction parallel or antiparallel to the magnetization direction of the reference layer by controlling the current to be applied to the nonmagnetic layer. An MRAM that performs writing by using this principle is called an SOT-MRAM.

An SOT cell that is a memory cell used in an SOT-MRAM has a memory element with three terminals. Since a read current path and a write current path are different, two or three transistors are provided for one SOT cell. Therefore, the area occupied by memory cells becomes larger.

DETAILED DESCRIPTION

Figure 1:
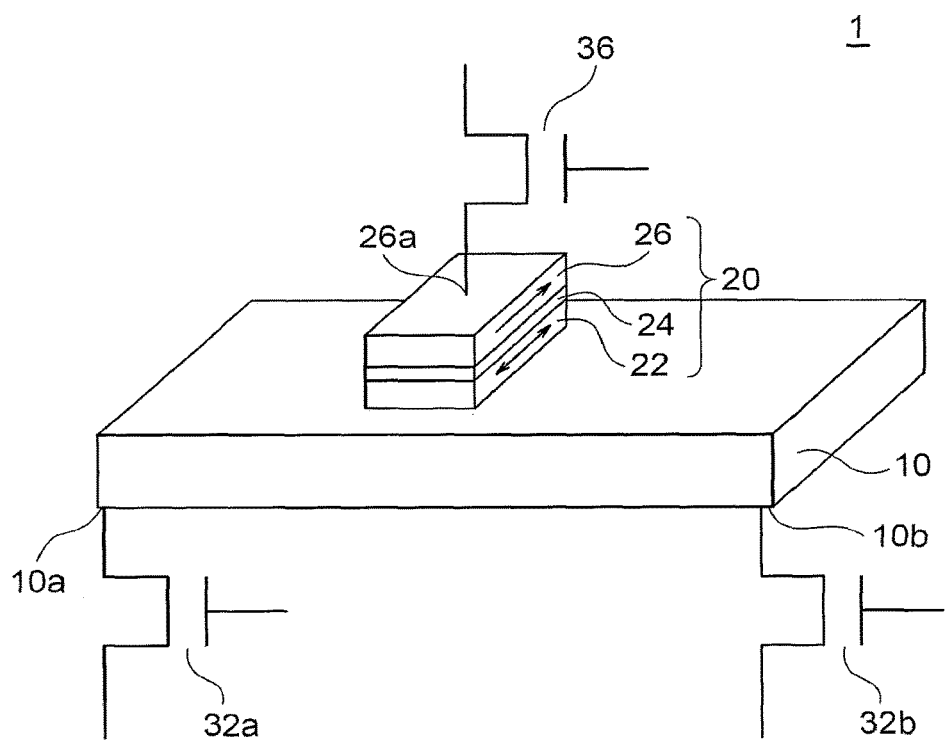
FIG. 1 is a diagram showing an example of a memory cell in an SOT-MRAM.

A magnetic memory according to an embodiment includes: a first nonmagnetic layer including a first face and a second face opposed to the first face, the first nonmagnetic layer being conductive; a first and second wirings disposed on a side of the first face of the first nonmagnetic layer, and intersecting with the first nonmagnetic layer respectively; a third wiring disposed on a side of the second face of the first nonmagnetic layer; a first transistor disposed between the first wiring and the first nonmagnetic layer, the first transistor including a source and a drain, one of the source and the drain being connected to the first wiring, the other one being connected to the first nonmagnetic layer; a second transistor disposed between the second wiring and the first nonmagnetic layer, the second transistor including a source and a drain, one of the source and the drain being connected to the second wiring, the other one being connected to the first nonmagnetic layer; a magnetoresistive element disposed between the first nonmagnetic layer and the third wiring, the magnetoresistive element including a first terminal and a second terminal, the first terminal being connected to the first nonmagnetic layer; and a third transistor including a source and a drain, one of the source and the drain being connected to the second terminal, the other one being connected to the third wiring.

The following is a detailed description of embodiments of the present invention, with reference to the accompanying drawings. In each of the embodiments described below, a magnetic memory that uses a spin Hall effect or a spin-orbit interaction (spin-orbit coupling), or an SOT-MRAM that reverses the magnetization direction of the storage layer with spin orbit torque (SOT), is used.

Before the embodiments are described, an SOT-MRAM is briefly explained. An SOT-MRAM includes at least one memory cell, and this memory cell 1 is shown in FIG. 1.

The memory cell 1 includes a conductive nonmagnetic layer 10 having a first terminal 10a and a second terminal 10b, a magnetoresistive element 20 disposed on the nonmagnetic layer 10, write transistors 32a and 32b, and a read transistor 36. The magnetoresistive element 20 is disposed on the nonmagnetic layer 10, and includes a stack structure formed by stacking a storage layer 22, a nonmagnetic layer 24, and a magnetic layer 26 in this order. The write transistor 32a has one of the source and the drain connected to the first terminal 10a of the nonmagnetic layer 10. The write transistor 32b has one of the source and the drain connected to the second terminal 10b of the nonmagnetic layer 10. The magnetic layer 26 has a terminal 26a, and one of the source and the drain of the read transistor 36 is connected to the terminal 26a. That is, the memory cell 1 includes the three terminals 10a, 10b, and 26a.

Figure 2:
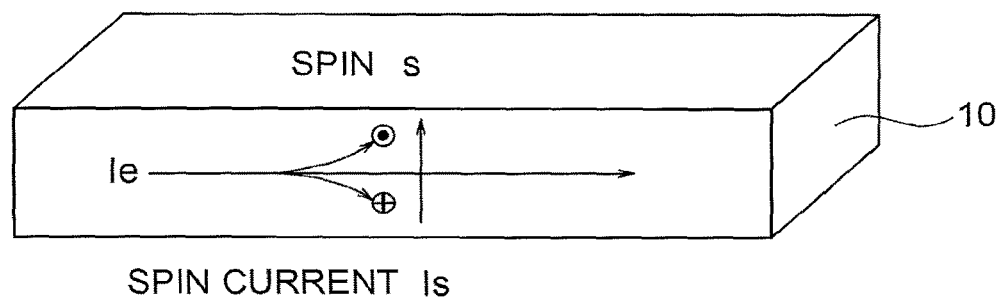
FIG. 2 is a diagram for explaining a spin-orbit interaction.

Next, a write operation and a read operation in the memory cell 1 shown in FIG. 1 are described, with reference to FIGS. 1 and 2.

(Write Operation)

A write operation is performed by applying current between the first terminal 10a and the second terminal 10b of the nonmagnetic layer 10. For example, as shown in FIG. 2, when an electron current is applied to the nonmagnetic layer 10 from left to right in the drawing, electrons of one type (up-spin electrons, for example) among up-spin electrons and down-spin electrons flow into the upper surface of the nonmagnetic layer 10, and electrons of the other type (down-spin electrons, for example) flow into the lower surface of the nonmagnetic layer 10 by the spin-orbit interaction. That is, electrons spin-polarized in one of the orientations of up-spin and down-spin flow into the upper surface of the nonmagnetic layer 10 from left to right in the drawing, and electrons spin-polarized in the other orientation flow into the lower surface of the nonmagnetic layer 10. As a result, the spin torque from the electrons that are spin-polarized in the one orientation and flow in the upper surface of the nonmagnetic layer 10 affects the magnetization of the magnetic layer 22, so that the magnetization direction of the magnetic layer 22 can be reversed. The nonmagnetic layer 10 is a layer serving to cause a spin-orbit interaction. When an electron current is applied to the nonmagnetic layer 10 from right to left in the drawing, down-spin electrons flow into the upper surface of the nonmagnetic layer 10, and up-spin electrons flow into the lower surface of the nonmagnetic layer 10, which is the opposite of the above described case. In this manner, the magnetization direction of the magnetic layer 22 can be reversed in accordance with the directions of the currents flowing in the nonmagnetic layer 10.

To cause a write operation in the memory cell shown in FIG. 1, a first write circuit (not shown) first turns on the write transistors 32a and 32b of the memory cell on which writing is to be performed. The first write circuit adjusts the voltage to be applied to the write transistors 32a and 32b, so that the write transistors 32a and 32b can be put into an on-state. In this state, a second write circuit (not shown) applies a write current between the first terminal 10a and the second terminal 10b of the nonmagnetic layer 10.

As this write current flows in the in-plane direction of the nonmagnetic layer 10, the effect of a spin-orbit interaction appears, and magnetic torque is applied to the magnetic layer 22.

Consequently, the magnetization direction of the magnetic layer 22 is reversed, and a write operation is performed.

(Read Operation)

To perform a read operation, the read transistor 36 is switched on, and one of the write transistors 32a and 32b, or the write transistor 32a, for example, is turned on. A read circuit (not shown) then applies a read current to the nonmagnetic layer 10 and the magnetoresistive element 20 via these transistors.

As can be seen from FIG. 2, the direction of the spin current Is and the direction of the spin s are perpendicular to each other. Therefore, to apply spin torque efficiently, magnetic layers having a magnetization direction perpendicular to the stacking direction of the magnetoresistive element 20 or parallel to the film plane are preferably used as the reference layer 26 and the storage layer 22 (the magnetic layers will be hereinafter referred to as in-plane magnetic layers). The in-plane magnetic layer normally maintains magnetic anisotropy by having shape anisotropy.

Figure 3A:
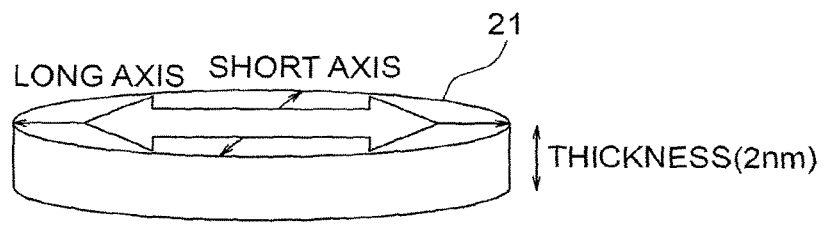
FIG. 3A is a diagram showing a magnetic layer having shape anisotropy.
Figure 3B:
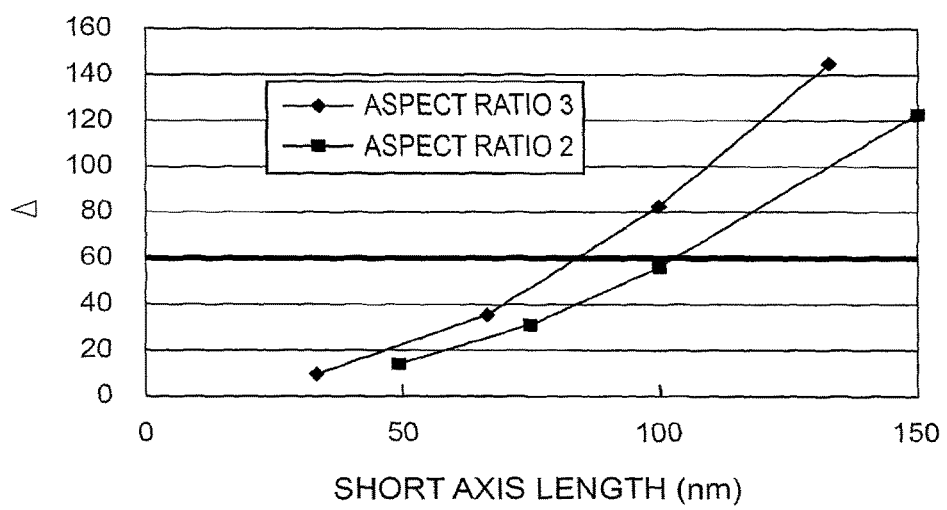
FIG. 3B is a graph showing a relationship between memory retention energy and shape anisotropy.

FIG. 3B shows an example of calculation of the memory retention energy Δ of the in-plane magnetic layer 21 having shape anisotropy shown in FIG. 3A. The abscissa axis indicates the length (nm) of the short axis of the in-plane magnetic layer 21, and the ordinate axis indicates the memory retention energy Δ. In the calculation, the thickness of the in-plane magnetic layer 21 is 2 nm, the saturation magnetization Ms is 1000 emu/cc, the Boltzmann constant $k_B$ is $1.38 \times 10^{-16}$ erg, and the absolute temperature T is 300 K. In FIG. 3B, an aspect ratio is the ratio between the length of the long axis and the length of the short axis of each in-plane magnetic layer. In a case where a magnetoresistive element is used as a storage element, the memory retention energy Δ is preferably in the neighborhood of 60. However, as can be seen from FIG. 3B, the magnetic anisotropy energy Ku of the in-plane magnetic layer having shape anisotropy is on the order of $10^5$ erg/cm$^3$. Therefore, as the magnetoresistive element becomes smaller, it becomes difficult to maintain a memory retention energy. That is, it becomes difficult to maintain a sufficiently large magnetic anisotropy energy by having shape anisotropy.

In view of the above, the inventors made intensive studies, to successfully develop a magnetic memory capable of preventing an increase in the area occupied by memory cells. This will be explained in the embodiments described below.

First Embodiment

Figure 4:
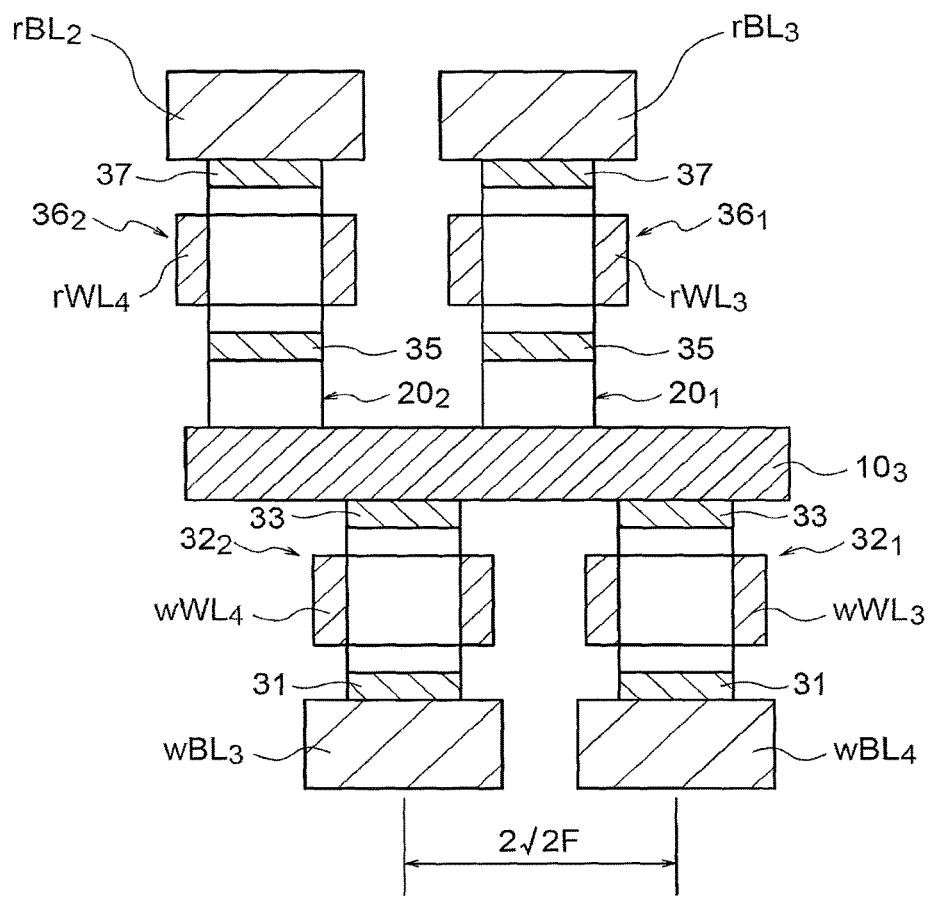
FIG. 4 is a cross-sectional view of a magnetic memory according to a first embodiment.
Figure 5:
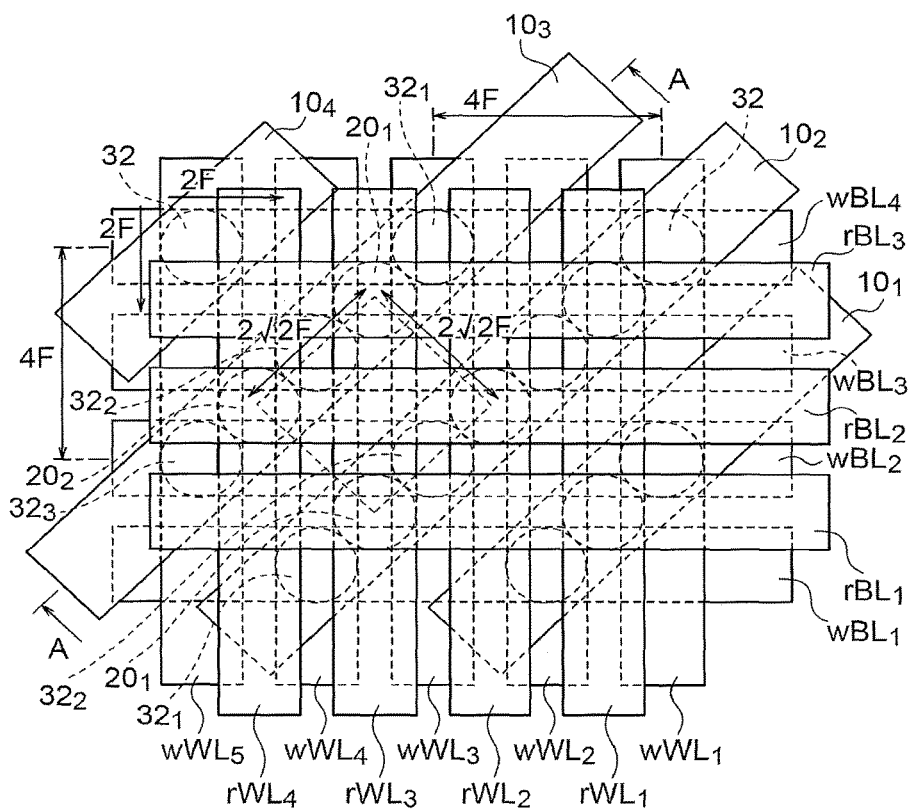
FIG. 5 is a top view of the magnetic memory according to the first embodiment.

Referring to FIGS. 4 and 5, a magnetic memory according to a first embodiment is described. FIG. 4 is a cross-sectional view of the magnetic memory of the first embodiment. FIG. 5 is a plan view of the magnetic memory of the first embodiment. FIG. 4 is a cross-sectional view taken along the section line A-A defined in FIG. 5.

Figure 6:
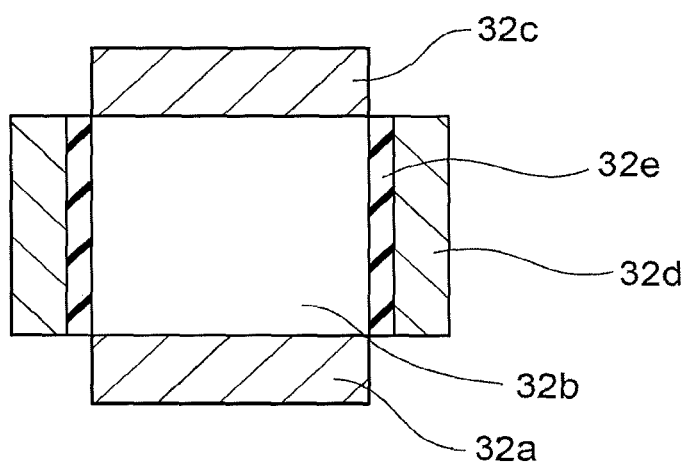
FIG. 6 is a cross-sectional view of a vertical transistor.

The magnetic memory of the first embodiment includes write bit lines $wBL_1$ through $wBL_4$ arranged in parallel on a substrate (not shown). Where the minimum feature size is F, write transistors 32 are provided at intervals of 4F on each write bit line $wBL_i$ (i=1, 2, 3, 4). For example, three write transistors 32 are provided on the write bit line $wBL_4$ in FIG. 5. Each write transistor 32 is a vertical transistor. FIG. 6 shows an example of a cross-section of a vertical transistor. This vertical transistor 32 has a stack structure formed by stacking a lower electrode 32a, a semiconductor layer 32b serving as the channel, and an upper electrode 32c in this order. Further, a gate electrode 32d is disposed on a side surface of the semiconductor layer 32b, and a gate insulating film 32e is disposed between the semiconductor layer 32b and the gate electrode 32d. In this specification, a vertical transistor is a transistor having a structure in which the source and the drain are arranged in the stacking direction, and the semiconductor layer serving as the channel is disposed between the source and the drain. For example, in FIG. 6, one of the source and the drain is the lower electrode 32a, and the other one of the source and the drain is the upper electrode 32c.

As shown in FIG. 4, a conductive layer 31 is provided between the lower electrode of each vertical transistor 32 and the write bit line on which this transistor 32 is located. For example, conductive layers 31 are disposed between the lower electrode of the write transistor $32_1$ and the write bit line $wBL_4$, and between the lower electrode of the write transistor $32_2$ and the write bit line $wBL_3$.

Write word lines $wWL_1$ through $wWL_5$ that intersect with the write bit lines $wBL_1$ through $wBL_4$ are also provided. In FIG. 5, the write bit lines $wBL_1$ through $wBL_4$ are perpendicular to the write word lines $wWL_1$ through $wWL_5$. The gate electrodes of write transistors 32 arranged at the intervals of 4F are connected to each write word line $wWL_i$ (i=1, ... 5). For example, the gate electrodes of two write transistors 32 are connected to the write word line $wWL_5$ in FIG. 5.

Conductive nonmagnetic layers $10_1$ through $10_4$ that intersect with the write bit lines $wBL_j$ (j=1, ... 4) and the write word lines $wWL_i$ (i=1, ... 5) at 45 degrees are provided. Each nonmagnetic layer $10_k$ (k=1, ... 4) is connected, via conductive layers 33, to the upper electrodes of write transistors 32 arranged at intervals of $2(2)^{1/2}F$. For example, the nonmagnetic layer $10_2$ is connected to the respective upper electrodes of the write transistor $32_1$ and the write transistor $32_2$ via conductive layers 33. As can be seen from FIGS. 4 and 5, the write transistor $32_1$ and the write transistor $32_2$ are arranged at an interval of $2(2)^{1/2}F$.

Magnetoresistive elements $20_1$, $20_2$, ... are disposed on each nonmagnetic layer $10_i$ (i=1, ... 4). These magnetoresistive elements $20_j$ (j=1, 2, ... ) are MTJ elements, for example. Alternatively, giant magnetoresistive (GMR) elements that have nonmagnetic conductive layers in place of the nonmagnetic insulating layers of MTJ elements may be used as the magnetoresistive elements.

The write transistors 32 are disposed in regions located on the opposite side of the nonmagnetic layers $10_i$ from the regions between the adjacent magnetoresistive elements disposed on the nonmagnetic layers $10_1$ (i=1, ... 4). That is, the adjacent magnetoresistive elements disposed on the nonmagnetic layers $10_i$ (i=1, ... 4) share the write transistors 32. For example, as shown in FIG. 4, the adjacent magnetoresistive elements $20_1$ and $20_2$ disposed on the nonmagnetic layer $10_3$ share the write transistor $32_2$.

As shown in FIG. 4, vertical read transistors $36_i$ are disposed on each magnetoresistive element $20_i$ (i=1, ... ) via conductive layers 35. Specifically, the lower electrodes of the read transistors $36_i$ (i=1 ... ) are electrically connected to the reference layers of the corresponding magnetoresistive elements via conductive layers 35. Also, the upper electrodes of the read transistors $36_i$ (i=1, ... ) are connected to read bit lines $rBL_j$ via conductive layers 37. The gate electrodes of the read transistors $36_i$ (i=1, ... ) are connected to read word lines. For example, as shown in FIG. 4, the gate electrode of the read transistor $36_1$ is connected to a read word line $rWL_3$, and the gate electrode of the read transistor $36_2$ is connected to a read word line $rWL_4$. These read word lines $rWL_j$ (j=1, ... ) are arranged parallel to the write word lines $wWL_j$. Also, the respective read bit lines $rBL_i$ (i=1, . . . ) are arranged parallel to the write bit lines $wBL_j$.

In this arrangement, the write transistors connected to one nonmagnetic layer are connected to different write bit lines from each another. Further, the write transistors connected to one nonmagnetic layer are connected to different write word lines from each another.

It should be noted that the axis of easy magnetization of the storage layer and the magnetization direction of the reference layer of each magnetoresistive element are perpendicular to the direction in which the nonmagnetic layers extend. The magnetic anisotropy of the storage layer is given by shape magnetic anisotropy, crystal magnetic anisotropy, induced magnetic anisotropy, a magnetostrictive effect, or the like.

One of the electrodes of each read transistor is connected to the opposite side of the magnetoresistive element from the nonmagnetic layer, and the other one of the electrodes is connected to the read bit line. The read transistors overlap with the magnetoresistive elements, and therefore, are not shown in FIG. 5.

In the magnetic memory of the first embodiment designed as above, the cell size per bit is defined by the pitch of the write bit line and the write word lines. In FIG. 5, the intervals between the write bit lines and the write word lines are set at 2F, to minimize the cell size. The cell size in this case is $2(2)^{1/2}F \div 2(2)^{1/2}F = 8F^2$, as shown in FIG. 5.

In FIG. 5, each magnetoresistive element 20 has an isotropic shape, being circular in planar shape. However, each magnetoresistive element may be anisotropic in planar shape. The direction in which spin torque generated by a spin Hall effect is applied is perpendicular to the direction in which the nonmagnetic layers extend. Therefore, in a case where the long axis of each magnetoresistive element is perpendicular to the direction in which each nonmagnetic layer extends, the axis of easy magnetization of the storage layer by virtue of shape anisotropy is oriented in this direction, and the spin torque generated by the spin Hall effect can be efficiently applied. In a case where the storage layer of each magnetoresistive element is made to have anisotropy and have its easy axis in a direction perpendicular to the extending direction of the nonmagnetic layers by a method not using shape anisotropy but using crystal magnetic anisotropy, magnetostriction, or the like, each magnetoresistive element may be isotropic in planar shape, or can be made to have anisotropy and have its long axis in the extending direction of the nonmagnetic layers.

(Write Method)

Figure 7:
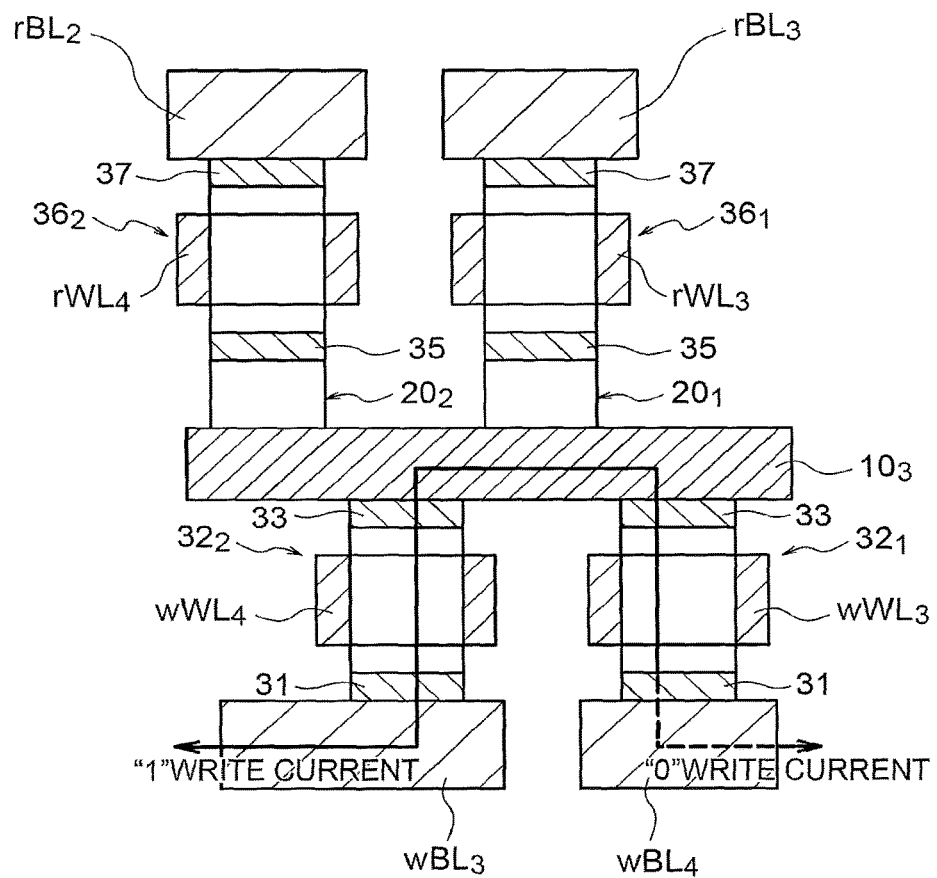
FIG. 7 is a cross-sectional view for explaining a method of writing in the magnetic memory according to the first embodiment.
Figure 8:
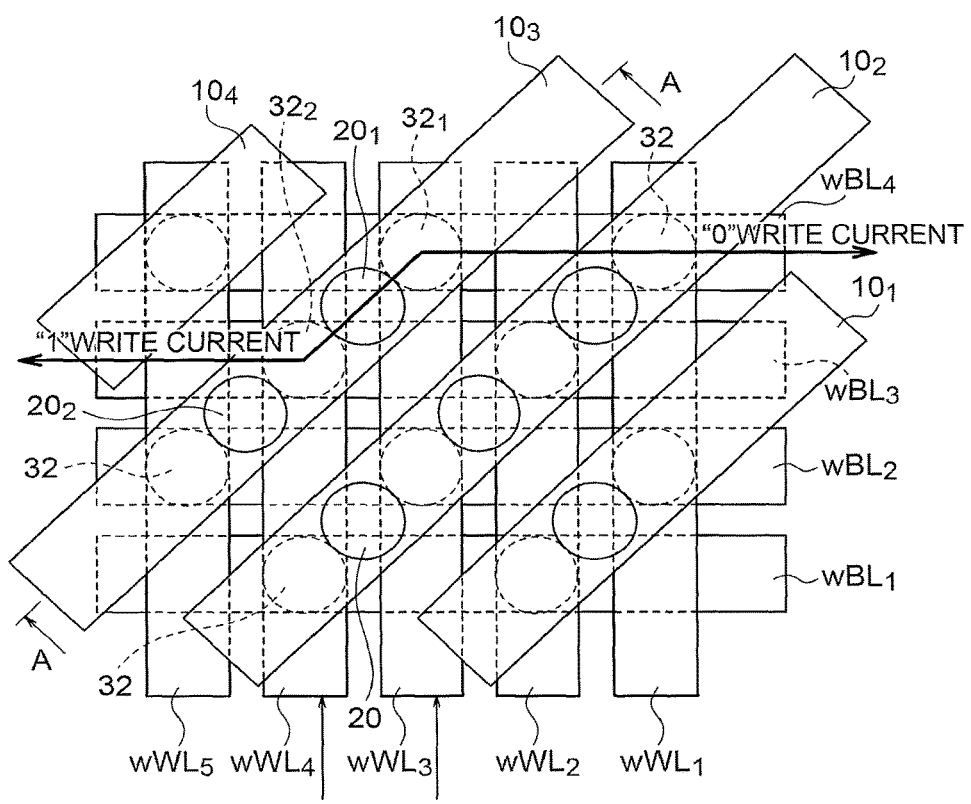
FIG. 8 is a top view for explaining the method of writing in the magnetic memory according to the first embodiment.

Referring now to FIGS. 7 and 8, an example of a write method in the magnetic memory of this embodiment is described. Specifically, an example case where writing is performed on the magnetoresistive element $20_1$ disposed on the nonmagnetic layer $10_3$ is described. FIG. 7 is a cross-sectional view taken along the section line A-A defined in FIG. 8. The section line A-A is parallel to the direction in which the nonmagnetic layer $10_3$ extends. The read transistors $36_1$ and $36_2$ shown in FIG. 7 and the read bit lines $rBL_2$ and $rBL_3$ are not used for writing, and therefore, are not shown in FIG. 8.

First, the two write transistors $32_1$ and $32_2$ are switched on. These write transistors $32_1$ and $32_2$ are located closest to the selected magnetoresistive element $20_1$ among the write transistors connected to the nonmagnetic layer $10_3$ on which the magnetoresistive element $20_1$ is provided. As the write transistors $32_1$ and $32_2$ are switched on, the write word lines $wWL_3$ and $wWL_4$ connected to these two write transistors are activated. In this situation, a potential gradient is caused between the write bit lines $wBL_3$ and $wBL_4$ connected to the write transistors $32_1$ and $32_2$, respectively. The polarity of the potential gradient is determined by write data. For example, when data "0" is to be written, the write bit line $wBL_4$ is set at 1 V, and the write bit line $wBL_3$ is set at 0 V. When data "1" is to be written, the write bit line $wBL_4$ is set at 0 V, and the write bit line $wBL_3$ is set at 1 V. As indicated by arrows in FIGS. 7 and 8, when data "0" is to be written, the write current flows from the write bit line $wBL_4$ to the write bit line $wBL_3$ through the write transistor $32_2$, the nonmagnetic layer $10_3$, and the write transistor $32_1$. With this write current, polarized spins are injected from the nonmagnetic layer $10_3$ into the storage layer of the selected magnetoresistive element $20_1$, and the magnetization direction of the storage layer is switched to a low-resistance state.

When data "1" is to be written, on the other hand, the voltage to be applied to the write bit lines $wBL_3$ and $wBL_4$ is reversed, so that the write current flows from the write bit line $wBL_3$ to the write bit line $wBL_4$ through the write transistor $32_1$, the nonmagnetic layer $10_3$, and the write transistor $32_2$. As a result, the selected magnetoresistive element $20_1$ is put into a high-resistance state. At this point of time, the write bit lines other than the write bit lines $wBL_3$ and $wBL_4$ are set at the same potential, such as 0 V, so that these other write bit lines are not connected to the activated write word lines $wWL_1$ and $wWL_2$, and no current flows in the nonmagnetic layers other than the nonmagnetic layer $10_3$.

As described above, the nonmagnetic layers are arranged obliquely to the write word lines, the write bit lines, the read word line, and the read bit lines. The write transistors connected to one nonmagnetic layer are connected to different write bit lines from each other, and the write transistors connected to the one nonmagnetic layer are also connected to different write word lines from each other, so that the one nonmagnetic layer is shared by two or more magnetoresistive elements. Further, vertical transistors are used as the write transistors and the read transistors, so that the area occupied by memory cells can be reduced, and writing can be performed on any desired magnetoresistive element.

(Read Method)

Figure 9:
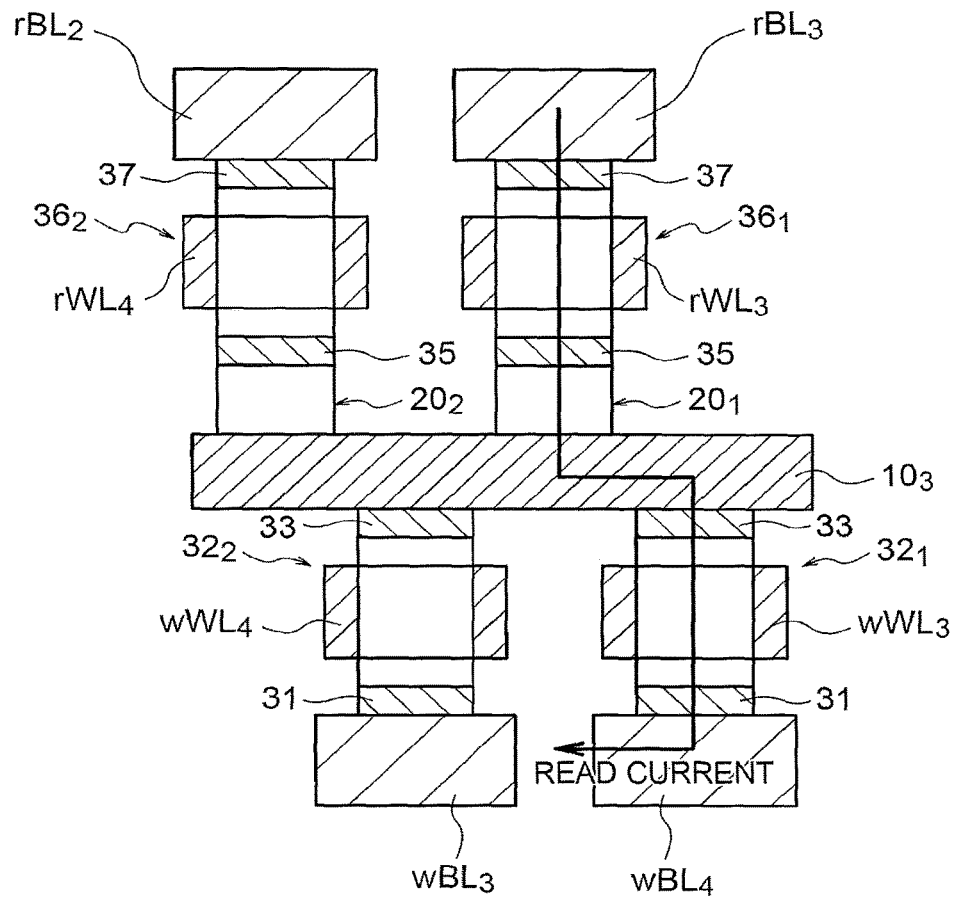
FIG. 9 is a cross-sectional view for explaining a method of reading from the magnetic memory according to the first embodiment.
Figure 10:
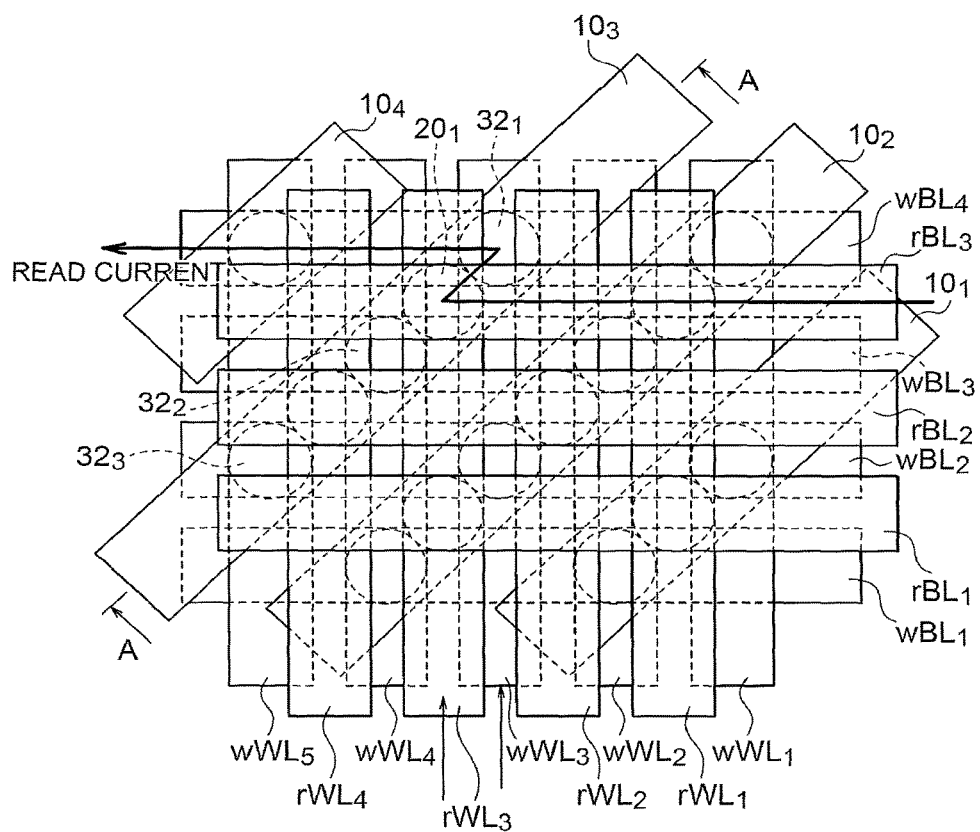
FIG. 10 is a top view for explaining the method of reading from the magnetic memory according to the first embodiment.

Referring now to FIGS. 9 and 10, an example of a method of reading data from a selected magnetoresistive element is described. Specifically, an example case where data is read from the magnetoresistive element $20_1$ provided on the nonmagnetic layer $10_3$ is described. FIG. 9 is a cross-sectional view taken along the section line A-A defined in FIG. 10. The section line A-A is parallel to the direction in which the nonmagnetic layer $10_3$ extends.

When data is to be read from the selected magnetoresistive element $20_1$, voltage is applied to the read word line $rWL_3$ and the write word line $wWL_3$, so that the read transistor $36_1$ and the write transistor $32_1$ are switched on. In this situation, a potential gradient is caused between the read bit line $rBL_3$ and the write bit line $wBL_3$, so that the read current flows as shown in FIGS. 9 and 10. For example, the difference in potential between the read bit line $rBL_3$ and the write bit line $wBL_3$ is set at 0.2 V. In the description of the above read method, voltage is applied to the read word line $rWL_3$ and the write word line $wWL_3$, so that the read transistor $36_1$ and the write transistor $32_1$ are switched on. Alternatively, voltage may be applied to the read word line $rWL_3$ and the write word line $wWL_4$, so that the read transistor $36_1$ and the write transistor $32_2$ are switched on before reading is performed.

As described above, according to the first embodiment, the nonmagnetic layers are arranged obliquely to the write word lines, the write bit lines, the read word line, and the read bit lines. The write transistors connected to one nonmagnetic layer are connected to different write bit lines from each other, and the write transistors connected to the one nonmagnetic layer are also connected to different write word lines from each other, so that the one nonmagnetic layer is shared by two or more magnetoresistive elements. Further, vertical transistors are used as the write transistors and the read transistors, so that the area occupied by memory cells can be reduced. In this manner, an increase in the area occupied by memory cells can be prevented.

Second Embodiment

Figure 11:
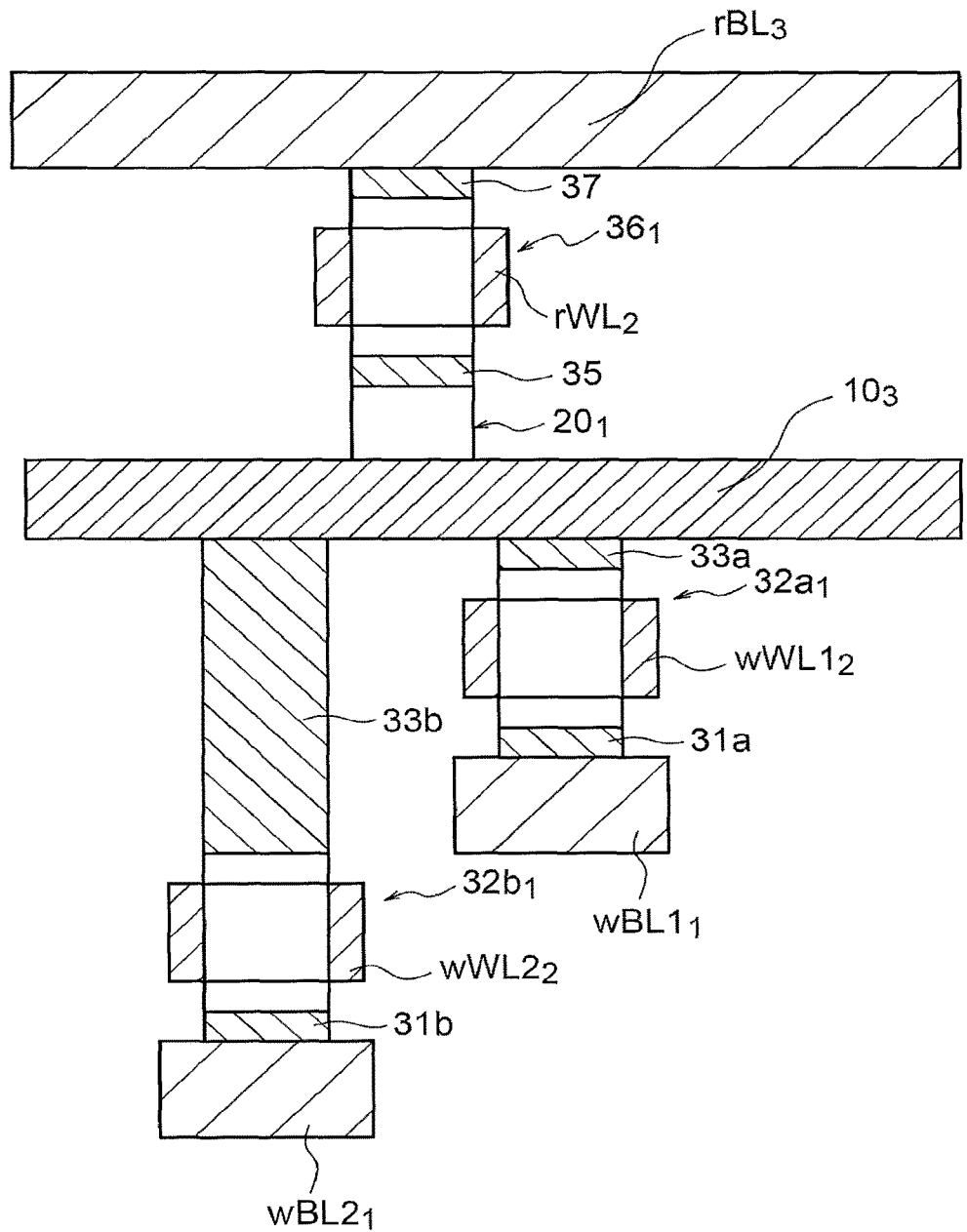
FIG. 11 is a cross-sectional view of a magnetic memory according to a second embodiment.
Figure 12:
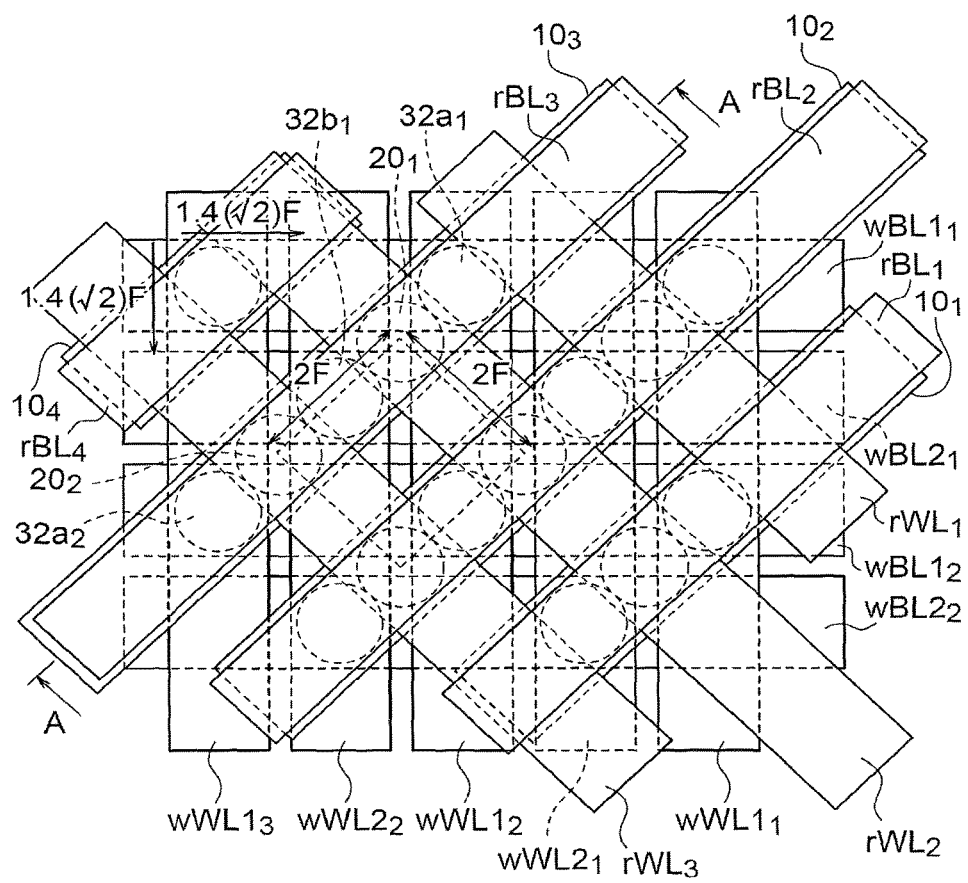
FIG. 12 is a top view of the magnetic memory according to the second embodiment.

Referring now to FIGS. 11 and 12, a magnetic memory according to a second embodiment is described. FIG. 11 is a cross-sectional view taken along the section line A-A defined in FIG. 12.

The magnetic memory of the second embodiment includes sets of a first write bit line $wBL1_i$ (i=1, 2, 3, . . . ) and a second write bit line $wBL2_j$ (j=1, 2, . . . ) that are placed at different levels and are arranged in parallel with each other. In FIG. 11, the second write bit lines $wBL2_j$ (j=1, 2, . . . ) are arranged parallel to each other in a lower layer, and the first write bit lines $wBL1_i$ (i=1, 2, 3, . . . ) are arranged parallel to each other in an upper layer. The first write bit line $wBL1_i$ (i=1, 2, 3, . . . ) are arranged at a pitch of $2(2)^{1/2}$, and the second write bit lines $wBL2_j$ (j=1, 2, . . . ) are arranged at a pitch of $2(2)^{1/2}F$. Also, the first write bit lines $wBL1_i$ (i=1, 2, 3, . . . ) and the second write bit lines $wBL2_j$ (j=1, 2, . . . ) are arranged at a distance from one another so that no portions overlap with each other when viewed from above.

Further, nonmagnetic layers $10_k$ (k=1, 2, 3, . . . ) extending in a direction oblique to the first and the second write bit lines, and read bit lines $rBL_k$ provided immediately above the nonmagnetic layers $10_k$ are provided. That is, the nonmagnetic layers $10_k$ (k=1, 2, 3, . . . ) intersect with the first and second write bit lines, and extend in a direction at 45 degrees with respect to the first and second write bit lines. The nonmagnetic layers $10_k$ (k=1, 2, 3, . . . ) are arranged parallel to each other at a pitch of 2F. Also, the read bit lines $rBL_k$ (k=1, 2, 3, . . . ) are arranged parallel to each other at the pitch of 2F, and overlap with the nonmagnetic layers $10_k$ when viewed from above.

Further, first write word lines $wWL1_k$ (k=1, . . . ) are provided and arranged perpendicularly to the first write bit lines $wBL1_i$ (i=1, 2, 3, . . . ). Second write word lines $wWL2_k$ (k=1, . . . ) are provided and arranged perpendicularly to the second write bit lines $wBL2_j$ (j=1, 2, . . . ). Read word lines $rWL_3$ (j=1, . . . ) are provided and arranged perpendicularly to the read bit lines $rBL_k$ (k=1, 2, 3, . . . ).

Vertical first write transistors $32a_3$ (j=1, . . . ) are disposed in the cross regions between the first write bit lines $wBL1_1$ (i=1, 2, 3, . . . ) and the nonmagnetic layers $10_k$ (k=1, 2, 3, . . . ). For example, the first write transistor $32a_1$ is disposed between the nonmagnetic layer $10_3$ and the first write bit line $wBL1_2$, and the first write transistor $32a_2$ is disposed between the nonmagnetic layer $10_3$ and the first write bit line $wBL1_3$. Each first write transistor is connected to the corresponding first write bit line via a conductive layer, and is also connected to the corresponding nonmagnetic layer via a conductive layer. For example, the first write transistor $32a_1$ is connected to the corresponding first write bit line $wBL1_1$ via a conductive layer $31a$, and is also connected to the corresponding nonmagnetic layer $10_3$ via a conductive layer $33a$. Also, the gate electrode of each first write transistor is connected to the corresponding first write word line. For example, the first write transistor $32a_1$ is connected to the first write word line $wWL1_1$. The first write word lines $wWL1_i$ (i=1, . . . ) are arranged perpendicularly to the first and second write bit lines $wBL1_k$ and $wBL2_k$ (k=1, . . . ). Also, the first write word lines $wWL1_i$ (i=1, . . . ) are arranged parallel to each other at a pitch of $2(2)^{1/2}F$.

Vertical second write transistors $32b_3$ (j=1, . . . ) are disposed in the cross regions between the second write bit lines $wBL2_i$ (i=1, 2, 3, . . . ) and the nonmagnetic layers $10_k$ (k=1, 2, 3, . . . ). For example, the second write transistor $32b_1$ is disposed between the nonmagnetic layer $10_3$ and the second write bit line $wBL2_1$. Each second write transistor is connected to the corresponding second write bit line via a conductive layer, and is also connected to the corresponding nonmagnetic layer via a conductive layer. For example, the second write transistor $32b_1$ is connected to the corresponding second write bit line $wBL2_1$ via a conductive layer $31b$, and is also connected to the corresponding nonmagnetic layer $10_3$ via a conductive layer $33b$. Also, the gate electrode of each second write transistor is connected to the corresponding second write word line. For example, the second write transistor $32b_1$ is connected to the second write word line $wWL2_1$. The second write word lines $wWL2_i$ (i=1, . . . ) are arranged perpendicularly to the first and second write bit lines $wBL1_k$ and $wBL2_k$ (k=1, . . . ). Also, the second write word lines $wWL2_1$ (i=1, . . . ) are arranged parallel to each other at a pitch of $2(2)^{1/2}F$. The first and second write word lines are arranged parallel to each other at a pitch of $(2)^{1/2}F$. For example, the first write word line $wWL1_2$ and the second write word line $wWL2_2$ are arranged parallel to each other at the pitch of $(2)^{1/2}F$.

Magnetoresistive elements and read transistors provided on the magnetoresistive elements are disposed on the nonmagnetic layers $10_k$ (k=1, 2, 3, . . . ). For examples, the magnetoresistive elements $20_1$ and $20_2$ are disposed on the nonmagnetic layer $10_3$. The read transistor $36_1$ is disposed on the magnetoresistive element $20_1$. Although not shown in the drawings, a read transistor is also disposed on the magnetoresistive element $20_2$. In FIG. 11, the magnetoresistive element $20_2$ and the read transistor disposed thereon are not shown, either. Each read transistor is connected to the corresponding magnetoresistive element via a conductive layer, and is also connected to the corresponding read bit line via a conductive layer. For example, the read transistor $36_1$ is connected to the corresponding magnetoresistive element $20_1$ via a conductive layer $35$, and is also connected to the corresponding read bit line $rBL_3$ via a conductive layer $37$. The adjacent magnetoresistive elements $20_j$ (j=1, . . . ) on each of the nonmagnetic layers $10_k$ (k=1, 2, 3, . . . ) are arranged at a pitch of 2F. For example, the adjacent magnetoresistive elements $20_1$ and $20_2$ on the nonmagnetic layer $10_3$ are arranged at the pitch of 2F.

Two or more magnetoresistive elements are disposed on the upper surface of each nonmagnetic layer. A first write transistor and a second write transistor that form a pair are connected to the lower surface of the corresponding nonmagnetic layer, and are arranged in such a manner that the corresponding magnetoresistive element is located in between. For example, as shown in FIG. 11, the magnetoresistive element $20_1$ is disposed on the upper surface of the nonmagnetic layer $10_3$, and the first write transistors $32a_1$ and the second write transistors $32b_1$, which form a pair, are connected to the lower surface of the nonmagnetic layer $10_3$ and are arranged in such a manner that the magnetoresistive element $20_1$ is located in between.

The gate electrode of each read transistor is connected to the corresponding read word line. For example, the read transistor $36_1$ is connected to the read word line $rWL_2$. The respective read word lines $rWL_k$ (k=1, . . . ) are arranged perpendicularly to the nonmagnetic layers $10_i$ (i=1, . . . ), or to the read bit line $rBL_i$. The read word lines $rWL_k$ (k=1, . . . ) are arranged at a pitch of 2F.

That is, in the second embodiment, adjacent write transistors, adjacent write bit lines, and adjacent write word lines are arranged at different levels, to alleviate the restriction on the distance between wiring lines such as the write bit lines and the write word lines. For example, the first write bit lines are arranged at a different level from the second write bit lines, and accordingly, the distance between them can be made smaller than 2F. Thus, the cell size can be made smaller than that of the first embodiment. Meanwhile, the read bit lines are arranged parallel to the nonmagnetic layers, and the read word lines are arranged perpendicularly to the read bit lines. In this cell structure, the cell size is restricted by the distance between the nonmagnetic layers, between the write bit lines, and between the read bit lines. Where this distance is 2F, the cell size of one bit is $2F \times 2F = 4F^2$ (FIG. 12).

In the magnetic memory of the second embodiment designed as above, the cell size of one bit is $2F \times 2F = 4F^2$, which is smaller than the cell size in the magnetic memory of the first embodiment.

(Write Method)

A write method in the magnetic memory of the second embodiment is now described. A case where data is to be written into the magnetoresistive element $20_1$ disposed on the nonmagnetic layer $10_3$ is taken as an example. In this case, the pair of the first write transistor $32a_1$ and the second write transistor $32b_1$ that are connected to the nonmagnetic layer $10_3$ and are arranged in such a manner that the magnetoresistive element $20_1$ is located in between are first switched on. This is carried out by applying voltage to the first write word line $wWL1_2$ and the second write word line $wWL2_2$ connected to the respective gate electrodes of the first write transistor $32a_1$ and the second write transistor $32b_1$.

A potential gradient is then caused between the first write bit line $wBL1_1$ and the second write bit line $wBL2_1$, and the write current is applied between the first write bit line $wBL1_1$ and the second write bit line $wBL2_1$ via the nonmagnetic layer $10_3$ immediately below the magnetoresistive element $20_1$. In this manner, data is written into the magnetoresistive element $20_1$. Thus, writing according to the second embodiment can be performed in the same manner as writing according to the first embodiment.

(Read Method)

Next, a read method in the magnetic memory of the second embodiment is described, with reference to FIGS. 11 and 12. A case where data is to be read from the magnetoresistive element $20_1$ is taken as an example.

First, the read transistor $36_1$ and one of the first and second write transistors $32a_1$ and $32b_1$ are switched on. For example, in a case where the one of the transistors is the first write transistor $32a_1$, the first write transistor $32a_1$ can be switched on by applying current to the read word line $rWL_2$ connected to the gate electrode of the read transistor $36_1$ and the first write word line $wWL1_2$ connected to the first write transistor $32a_1$. In this situation, a potential gradient is caused between the read bit line $rBL_3$ and the first write word line $wWL1_2$, so that the read current is made to flow between the read bit line $rBL_3$ and the first write word line $wWL1_2$ via the magnetoresistive element $20_1$. At this point, the voltage between the read bit line $rBL_3$ and the first write word line $wWL1_2$ is measured. In this manner, data can be read from the magnetoresistive element $20_1$.

As described above, according to the second embodiment, an increase in the area occupied by memory cells can be prevented.

In the second embodiment shown in FIGS. 11 and 12, the first and second write bit lines are provided at different levels, and the read bit lines are provided at one level. To set the wiring pitch of the read bit lines at 2F or greater, the read bit lines are arranged perpendicularly to the write bit lines.

However, adjacent read bit lines may be arranged at different levels, so that the read bit lines and the read word lines can be arranged parallel to the write bit lines and the write word lines. This configuration is described below as a third embodiment.

Third Embodiment

Figure 13:
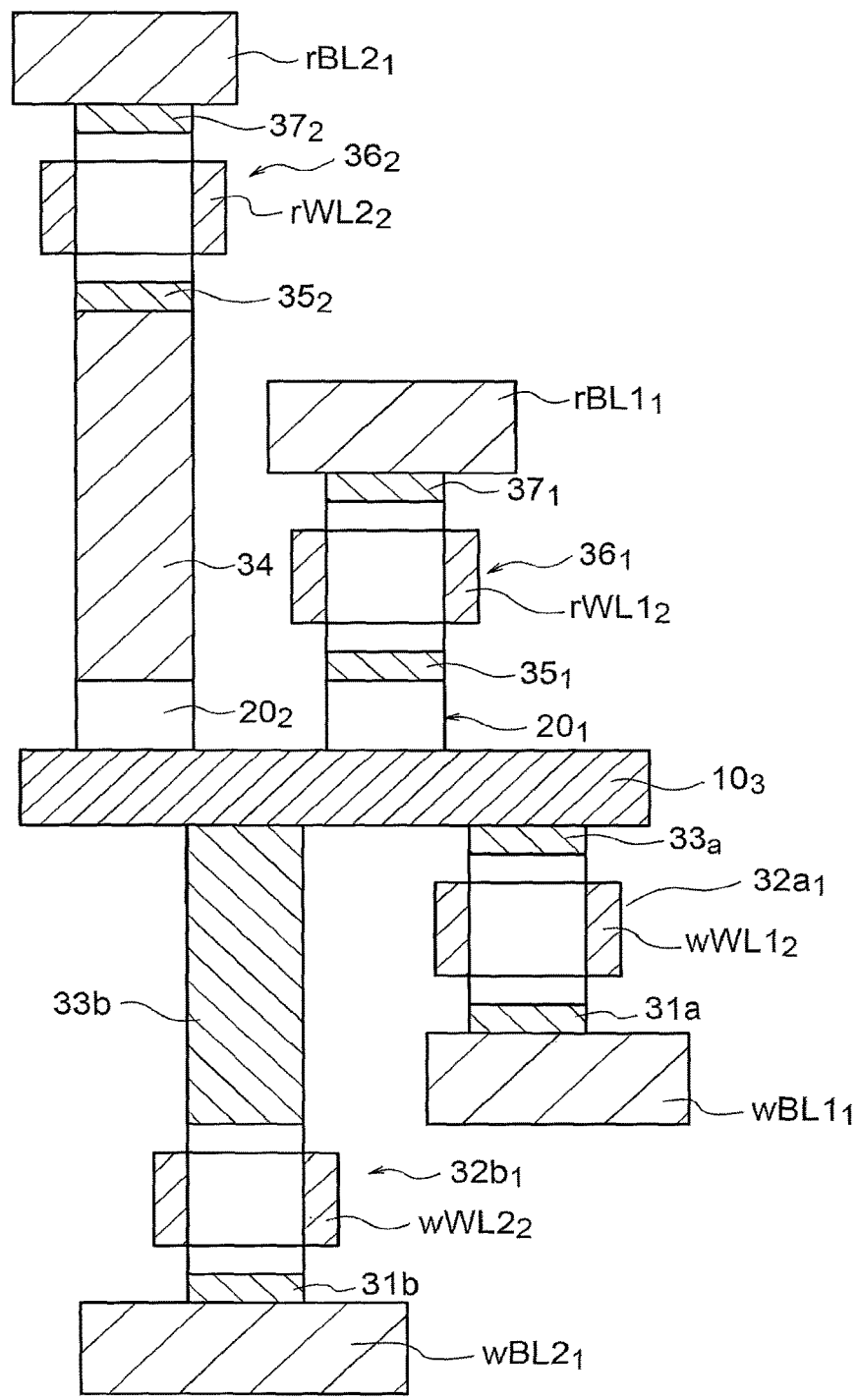
FIG. 13 is a cross-sectional view of a magnetic memory according to a third embodiment.
Figure 14:
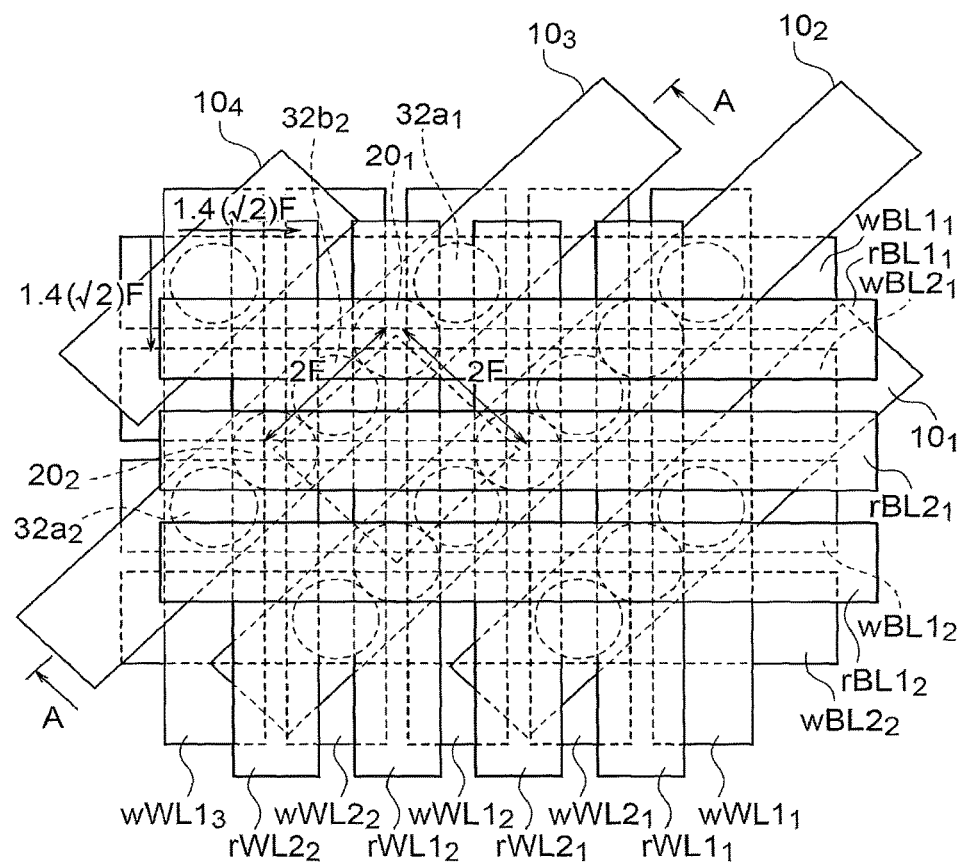
FIG. 14 is a top view of the magnetic memory according to the third embodiment.

Referring now to FIGS. 13 and 14, a magnetic memory according to a third embodiment is described. FIG. 13 is a cross-sectional view taken along the section line A-A defined in FIG. 14.

The magnetic memory of the third embodiment is the same as the magnetic memory of the second embodiment shown in FIGS. 11 and 12, except that the read bit lines $rBL_i$ (i=1, . . . ) are replaced with first read bit lines $rBL1_j$ (j=1, . . . ) and second read bit lines $rBL2_k$ (k=1, . . . ). Further, adjacent first and second read word lines are disposed at different levels, and adjacent first and second read bit lines are disposed at different level. The first read bit lines $rBL1_j$ (j=1, . . . ) and the second read bit lines $rBL2_k$ (k=1, . . . ) are arranged parallel to first write bit lines $wBL1_m$ (m=1, . . . ) and second write bit lines $wBL2_n$ (n=1, . . . ). Also, first read word lines $rWL1_j$ (j=1, . . . ) and the second read word lines $rWL2_k$ (k=1, . . . ) are arranged parallel to first write word lines $wWL1_m$ (m=1, . . . ) and second write word lines $wWL2_n$ (n=1, . . . ).

The read transistors provided on adjacent magnetoresistive elements on each nonmagnetic layer are arranged at different levels. For example, as shown in FIG. 13, the magnetoresistive element $20_1$ on the nonmagnetic layer $10_3$ is connected to the first read bit line $rBL1_1$ via a conductive layer $35_1$, a read transistor $35_1$, and a conductive layer $37_1$. The magnetoresistive element $20_2$ adjacent to the magnetoresistive element $20_1$ on the nonmagnetic layer $10_3$ is connected to the second read bit line $rBL2_1$ via a conductive layer $34$, a conductive layer $35_2$, a read transistor $36_2$, and a conductive layer $37_2$.

The gate electrode of a read transistor connected to a first read bit line is connected to a first read word line, and the gate electrode of a read transistor connected to a second read bit line is connected to a second read word line. For example, the gate electrode of the read transistor $36_1$ connected to the first read bit line $rBL1_1$ is connected to the first read word line $rWL1_2$, and the gate electrode of the read transistor $36_2$ connected to the second read bit line $rBL2_1$ is connected to the second read word line $rWL2_2$. The read transistor $36_1$ and the read transistor $36_2$ overlap with the magnetoresistive elements $20_1$ and $20_2$, respectively, and therefore, are not shown in FIG. 14.

A write method and a read method in the magnetic memory of the third embodiment are the same as those in the magnetic memory of the second embodiment shown in FIGS. 11 and 12.

As shown in FIG. 14, in the third embodiment, the adjacent magnetoresistive elements on the same nonmagnetic layer are arranged at a pitch of 2F, and the adjacent nonmagnetic layers are arranged at a pitch of 2F, as in the second embodiment.

Accordingly, the cell size of one bit is $2F \times 2F = 4F^2$, which is smaller than the cell size in the magnetic memory of the first embodiment.

As described above, according to the third embodiment, an increase in the area occupied by memory cells can be prevented.

Fourth Embodiment

Figure 15:
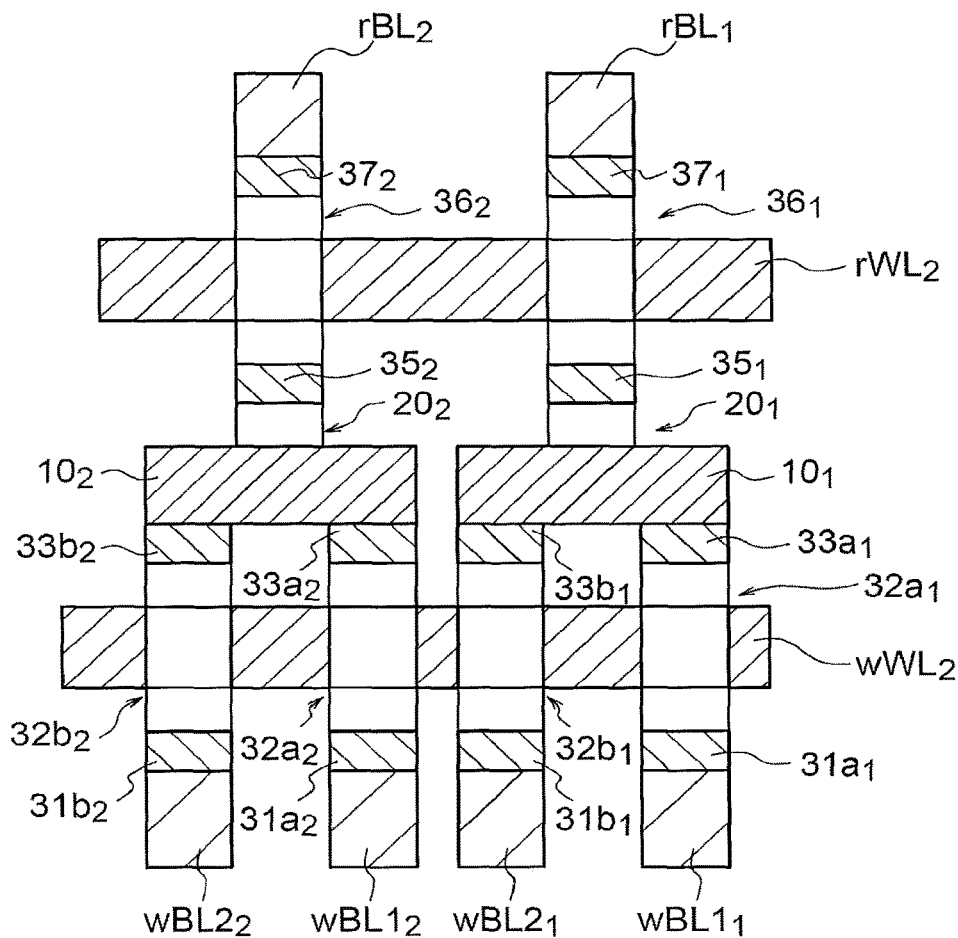
FIG. 15 is a cross-sectional view of a magnetic memory according to a fourth embodiment.
Figure 16:
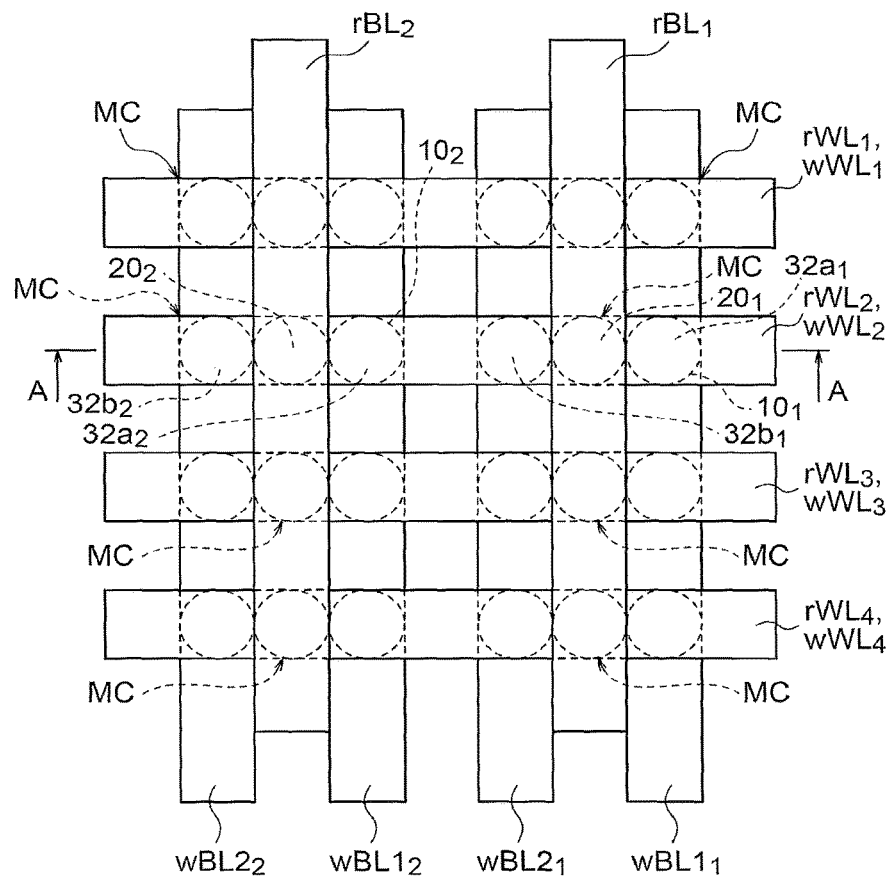
FIG. 16 is a top view of the magnetic memory according to the fourth embodiment.

Referring now to FIGS. 15 and 16, a magnetic memory according to a fourth embodiment is described. FIG. 16 is a plan view of the magnetic memory of the fourth embodiment. FIG. 15 is a cross-sectional view taken along the section line A-A defined in FIG. 16. The magnetic memory of the fourth embodiment has a structure in which nonmagnetic layers are divided and insulated on a bit-by-bit basis or on a memory cell basis.

In the magnetic memory of the fourth embodiment, memory cells MC are arranged in four rows and two columns, as shown in FIG. 16. Each of the memory cells MC includes an insulated nonmagnetic layer, a first write transistor, a second write transistor, a magnetoresistive element, and a read transistor. For example, the memory cell MC on the right side in FIG. 15 includes a nonmagnetic layer $10_1$, a first write transistor $32a_1$, a second write transistor $32b_1$, a magnetoresistive element $20_1$, and a read transistor $36_1$. The memory cell MC on the left side in FIG. 15 includes a nonmagnetic layer $10_2$, a first write transistor $32a_2$, a second write transistor $32b_2$, a magnetoresistive element $20_2$, and a read transistor $36_2$. In these memory cells, one of the source and the drain of each first write transistor $32a_i$ (i=1, 2) is connected to the first write bit line $wBL1_i$ via a conductive layer $31a$ and the other one of the source and the drain is connected to the nonmagnetic layer $10_i$ via a conductive layer $33a_1$. Each magnetoresistive element $20_i$ (i=1, 2) is disposed on the corresponding nonmagnetic layer $10_i$, and the magnetoresistive element $20_i$ is placed in a region of the nonmagnetic layer $10_i$, the region being located between the first write transistor $32a_i$ and the second write transistor $32b_i$. In this embodiment, with respect to the nonmagnetic layer $10_i$ of each memory cell, the first and second write transistors $32a_i$ and $32b_i$ are disposed on the lower surface side of the nonmagnetic layer $10_i$, and the magnetoresistive element $20_i$ is disposed on the upper surface side of the nonmagnetic layer $10_i$.

One of the source and the drain of each read transistor $36_i$ (i=1, 2) is connected to the corresponding magnetoresistive element $20_i$ via a conductive layer $35_i$, and the other one of the source and the drain is connected to the corresponding read bit line $rBL_i$ via a conductive layer $37_i$.

In the memory cells arranged in the same row, the respective gate electrodes of the first and second write transistors are connected to a common write word line. For example, the respective gate electrodes of the first and second write transistors $32a_1$, $32b_1$, $32a_2$, and $32b_2$ of the memory cells arranged in the second row are connected to a write word line $wWL_2$.

Also, in the memory cells arranged in the same row, the respective gate electrodes of the read transistors are connected to a common read word line. For example, the respective gate electrodes of the read transistors $36_1$ and $36_2$ of the memory cells arranged in the second row are connected to a read word line $rWL_2$.

In the memory cells arranged in the same column, a first write bit line is a common wiring line, a second write bit line is a common wiring line, and a read bit line is a common wiring line. As can be seen from FIG. 16, in the memory cells arranged in the same column, the read bit line is located between the first write bit line and the second write bit line when viewed from above. For example, each read bit line $rBL_i$ (i=1, 2) is provided between the corresponding first write bit line $wBL1_i$ and the corresponding second write bit line $wBL2_i$. Accordingly, the first write bit lines $wBL1_i$ (i=1, 2), the second write bit lines $wBL2_i$ and the read bit lines $rBL_i$ extend in the column direction.

On the other hand, the write word lines $wWL_j$ (j=1, ...) and the read word lines $rWL_j$ extend in the row direction, and the read word lines $rWL_j$ are arranged to overlap with the write word lines $wWL_j$ when viewed from above.

In the magnetic memory of the fourth embodiment designed as above, vertical transistors are used as the first and second write transistors and the read transistors. Thus, an increase in the area occupied by memory cells can be prevented.

(Write Method)

Figure 17:
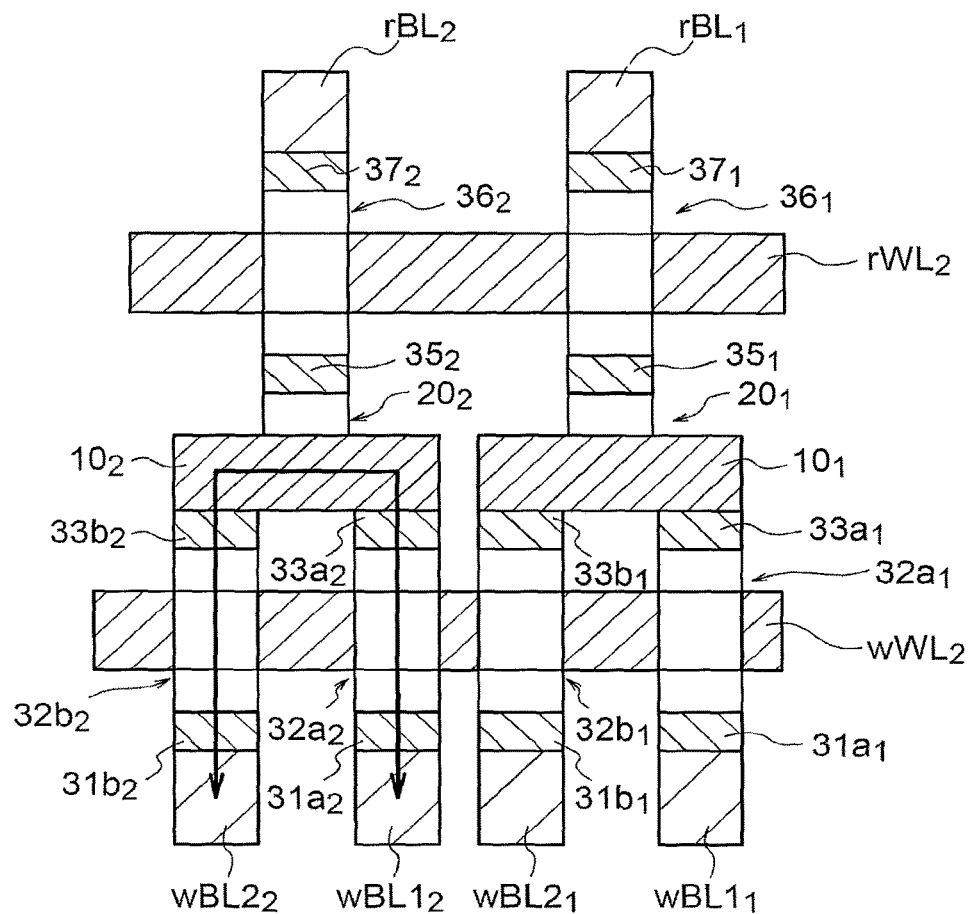
FIG. 17 is a cross-sectional view for explaining a method of writing in the magnetic memory according to the fourth embodiment.
Figure 18:
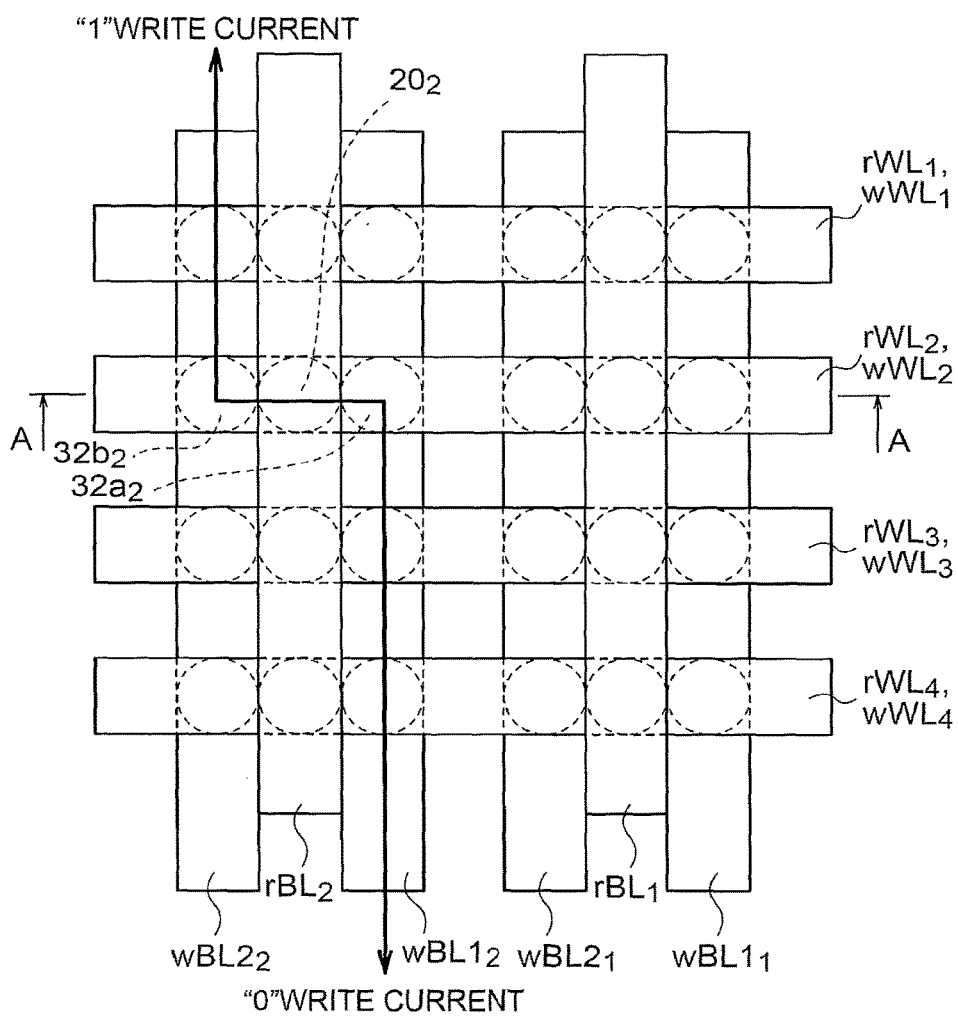
FIG. 18 is a top view for explaining the method of writing in the magnetic memory according to the fourth embodiment.

Referring now to FIGS. 17 and 18, a write method in the magnetic memory of the fourth embodiment is described.

FIG. 18 is a plan view of the magnetic memory of the fourth embodiment. FIG. 17 is a cross-sectional view taken along the section line A-A defined in FIG. 18. Writing to be performed on the magnetoresistive element $20_2$ of the memory cell in the second row is taken as an example of this write method described below.

First, voltage is applied to the write word line $wWL_2$ connected to the gate electrode of the magnetoresistive element $20_2$, so that the first write transistor $32a_2$ and the second write transistor $32b_2$ are switched on. A potential gradient is then caused between the first write bit line $wBL1_2$ and the second write bit line $wBL2_2$. As a result, a write current flows between the first write bit line $wBL1_2$ and the second write bit line $wBL2_2$ via the nonmagnetic layer $10_2$, and the magnetization direction of the storage layer of the magnetoresistive element $20_2$ disposed on the nonmagnetic layer $10_2$ can be reversed. In this manner, data can be written into the magnetoresistive element $20_2$. For example, as shown in FIGS. 17 and 18, when the write current is made to flow from the first write bit line $wBL1_2$ to the second write bit line $wBL2_2$ via the nonmagnetic layer $10_2$, data "0" can be written into the magnetoresistive element $20_2$. Also, when the write current is made to flow from the second write bit line $wBL2_2$ to the first write bit line $wBL1_2$ via the nonmagnetic layer $10_2$, data "1" can be written into the magnetoresistive element $20_2$.

(Read Method)

Figure 19:
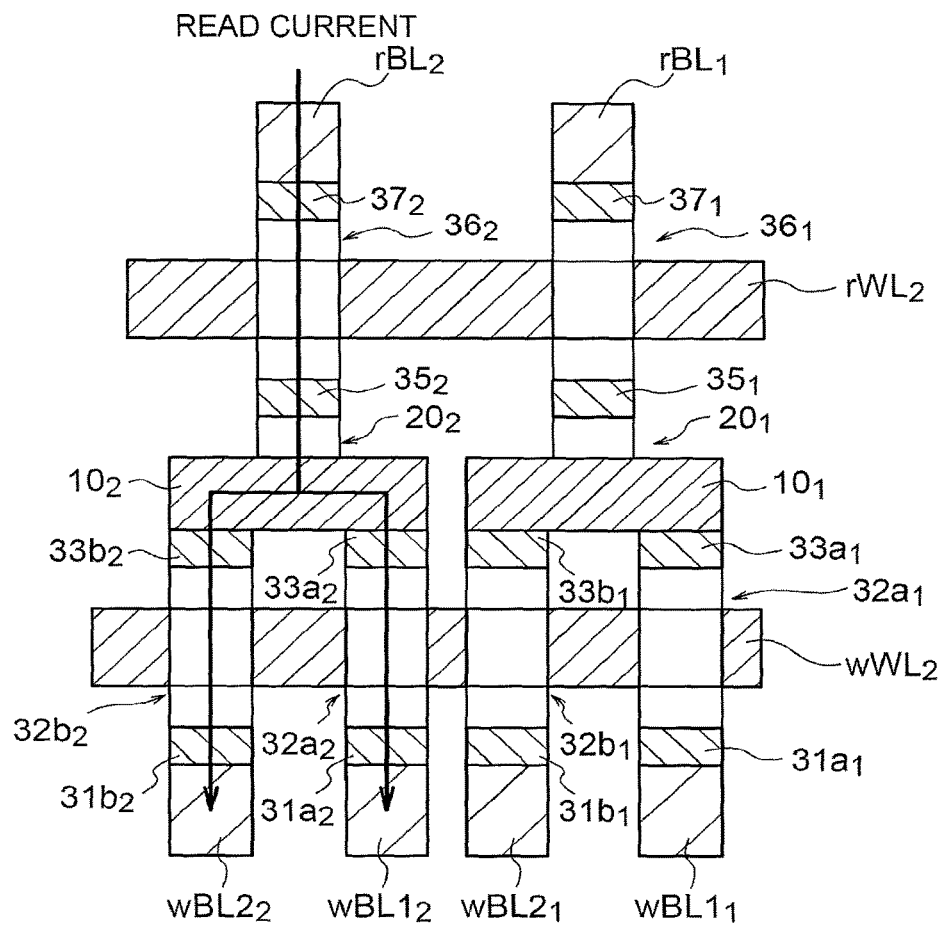
FIG. 19 is a cross-sectional view for explaining a method of reading from the magnetic memory according to the fourth embodiment.
Figure 20:
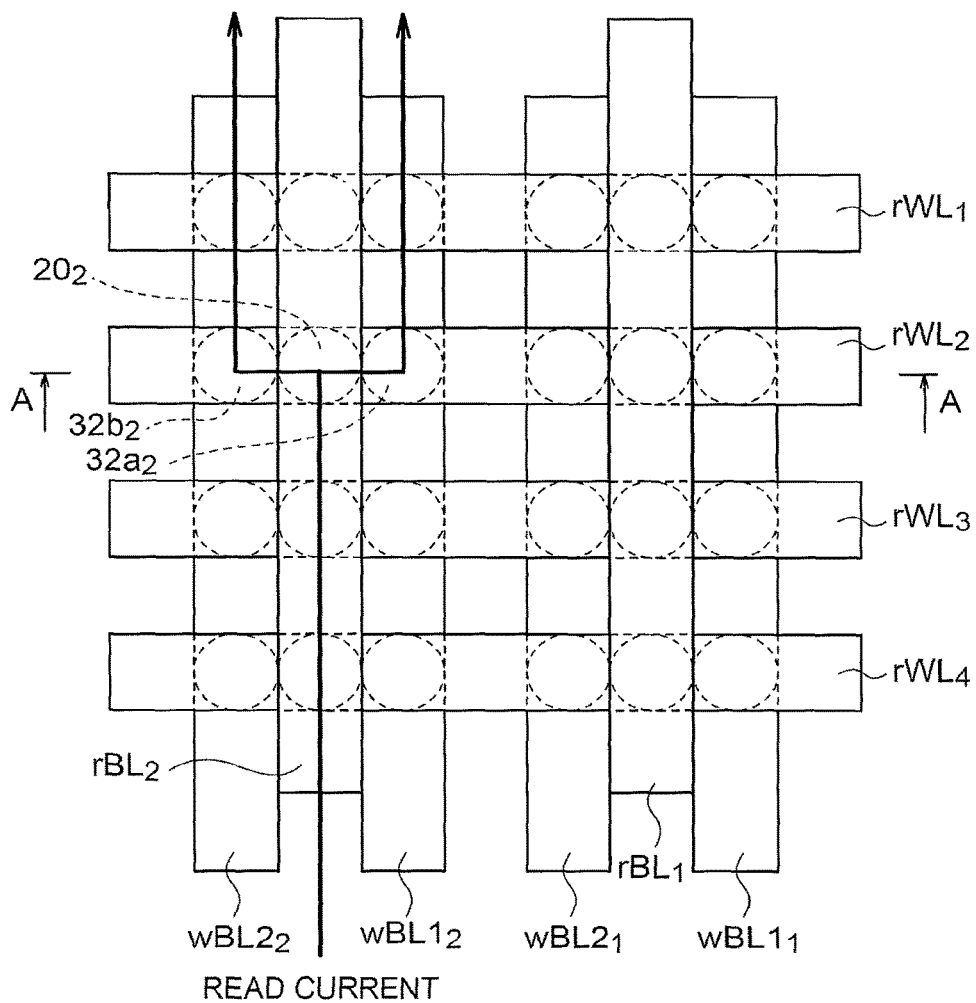
FIG. 20 is a top view for explaining the method of reading from the magnetic memory according to the fourth embodiment.

Referring now to FIGS. 19 and 20, a read method in the magnetic memory of the fourth embodiment is described. FIG. 20 is a plan view of the magnetic memory of the fourth embodiment. FIG. 19 is a cross-sectional view taken along the section line A-A defined in FIG. 20. Reading from the magnetoresistive element $20_2$ of the memory cell in the second row is taken as an example of this read method described below.

First, voltage is applied to the read word line $rWL_2$ connected to the gate electrode of the read transistor $36_2$, and to the write word line $wWL_2$, so that the read transistor $36_2$ and the first and second write transistor $32a_2$ and $32b_2$ are switched on. A potential gradient is then caused between the read bit line $rBL_2$ and one of the first write bit line $wBL1_2$ and the second write bit line $wBL2_2$. As a result, a read current flows in the magnetoresistive element $20_2$. At this point, the voltage between the read bit line $rBL_2$ and the one of the first write bit line $wBL1_2$ and the second write bit line $wBL2_2$ is measured. In this manner, the resistance state of the magnetoresistive element $20_2$ can be detected.

Fifth Embodiment

A magnetic memory according to a fifth embodiment is now described.

As shown in FIGS. 3A and 3B, where a magnetoresistive element having in-plane magnetization using shape anisotropy is made smaller in size, it becomes difficult to maintain anisotropy energy. There are magnetoresistive elements having in-plane magnetization that solves this problem. An SOT-MRAM including such magnetoresistive elements as storage elements is described below as the fifth embodiment.

The magnetic memory of the fifth embodiment is an SOT-MRAM that includes at least one memory cell having a magnetoresistive element as a storage element. In the magnetoresistive element, the two magnetic layers serving as the storage layer and the reference layer have in-plane crystal magnetic anisotropy.

Figure 21:
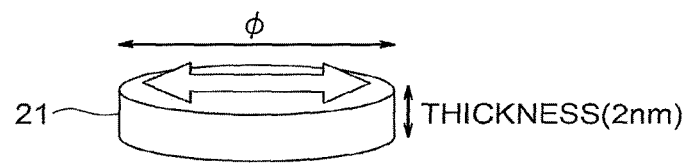
FIG. 21 is a diagram and a graph showing the diameter dependence of the memory retention energy of a magnetic layer.
Figure 21:
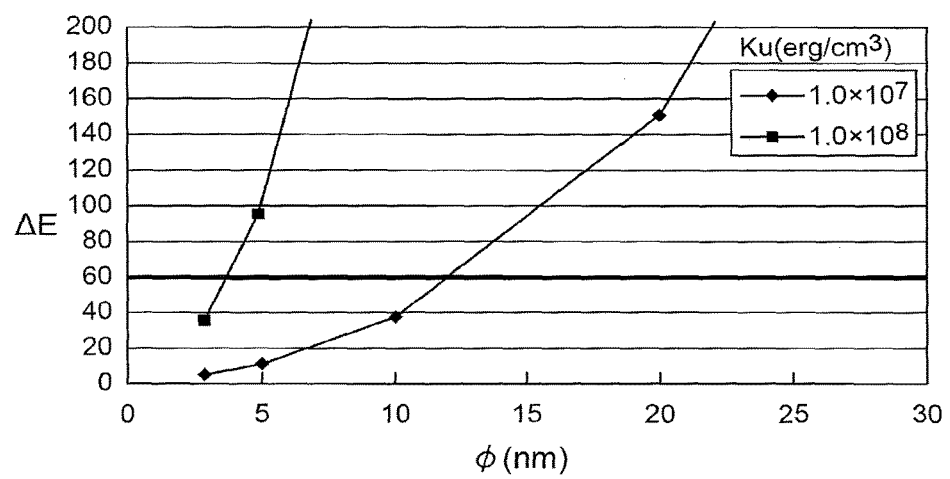

As the magnetic layers have crystal magnetic anisotropy, a material with a magnetic anisotropy energy Ku of $10^7$ erg/cm$^3$ to $10^8$ erg/cm$^3$ can be used. Where FePd, MnGa, or the like is used as the magnetic layers, the magnetic anisotropy energy Ku is $10^7$ erg/cm$^3$. Where FePt or the like is used, the magnetic anisotropy energy Ku is $10^8$ erg/cm$^3$. As a result, even a small magnetic layer 21 of 10 nm or less in diameter φ as shown in FIG. 21 can maintain a memory retention energy Δ of 60 or greater. In FIG. 21, the thickness of the magnetic layer 21 is 2 nm.

Figure 22A:
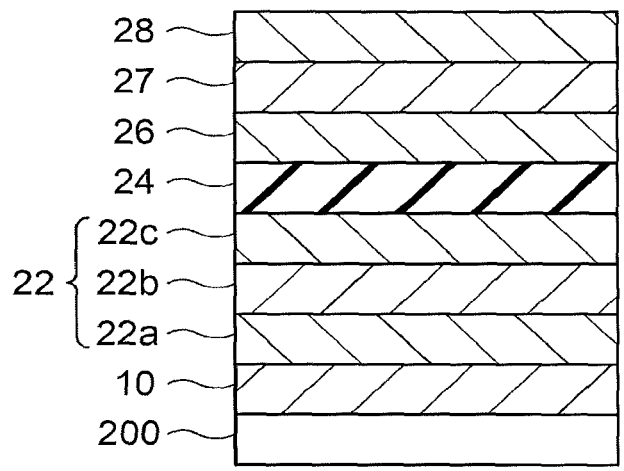
FIGS. 22A and 22B are cross-sectional views for explaining a method of manufacturing a memory cell of a fifth embodiment.
Figure 22B:
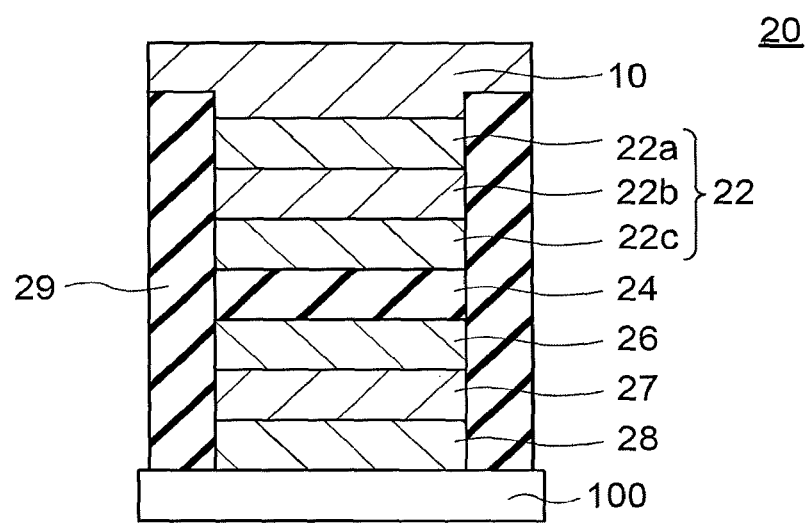

Referring now to FIGS. 22A and 22B, a method of manufacturing a magnetoresistive element in a memory cell of the magnetic memory of the fifth embodiment is described.

First, as shown in FIG. 22A, a Pt layer having a thickness of 10 nm, for example, is formed as a nonmagnetic layer 10 on a (110)-oriented crystalline Si substrate 200. A FePd layer having a thickness of 2 nm, for example, is formed as a portion 22a of the storage layer with in-plane crystal magnetic anisotropy on the Pt layer 10. This film formation is conducted where the substrate is heated to 500 degrees centigrade, for example. Reflecting the crystallinity of the Si substrate 200, the Pt layer 10 and the FePd layer 22a turn into (110)-oriented crystalline layers. The FePd layer 22a can have a large crystal magnetic anisotropy with Ku on the order of $10^7$ erg/cm$^3$ or higher in the (001) orientation. A (110)-oriented crystalline layer can be turned into an in-plane magnetization film having a large crystal magnetic anisotropy in the (001) orientation, which is the in-plane direction in a (110) plane.

A Ta layer 22b of 0.1 to 1 nm in thickness is then formed on the FePd layer 22a. The Ta layer 22b has a role of a functional layer that prevents diffusion of atoms such as Pt atoms or Pd atoms, and is designed to break the crystalline orientation of the FePd layer. The thickness of the Ta layer 22b is reduced to such a degree that the strength of the coupling between the magnetic layers on both sides can be maintained. A CoFeB layer 22c is formed on the Ta layer 22b. Further, a MgO layer as a tunnel barrier layer 24, a CoFe layer as a reference layer 26, an IrMn layer 27 for pinning the magnetization direction of the reference layer, and a Ta layer 28 as a cap layer are sequentially formed, to create a film stack. After the film formation, annealing is performed at 300 degrees centigrade for one hour, while a magnetic field is applied in such a direction as to pin the magnetization of the CoFe layer. The MgO layer 24 is (001)-oriented, and the CoFeB layer 22c and the CoFe layer 26 in contact with the MgO layer 24 are oriented in the same direction. A magnetic material containing at least one element selected from the group consisting of Fe, Co, and Mn, and at least one element selected from the group consisting of Pt, Pd, Au, Ru, Ga, and Ge may be used as the storage layer 22. In other words, the storage layer may include at least one element of Fe, Co, or Mn, and at least one element of Pt, Pd, Au, Ru, Ga, and Ge.

Other than the Pt layer mentioned above, Ru, Pd, Au, or the like may be used as the nonmagnetic layer 10. Also, other than the FePd layer mentioned above, FePt, MnGa, CoPt, or the like may be used as the storage layer 22a with in-plane crystal magnetic anisotropy. Also, a W layer, a Nb layer, or the like may be used in place of the Ta layer 22b.

The film stack formed in this manner is bonded to a circuit board 100 having a CMOS circuit formed therein (FIG. 22B). After the bonding, the Si substrate 200 is removed. Etching is then performed on the film stack by ion beam etching (IBE), to form the pillar of a magnetoresistive element 20. A side-wall protecting film 29 and an interlayer insulating film (not shown) are then formed. Further, a treatment is performed to increase the thickness of the Pt layer serving as the nonmagnetic layer 10. The reference layer 26 may have a synthetic antiferromagnetic (SAF) structure as a stack structure formed with CoFeB/Ru/CoFeB, for example, in which two CoFeB ferromagnetic layers are coupled antiparallel to each other.

Figure 23A:
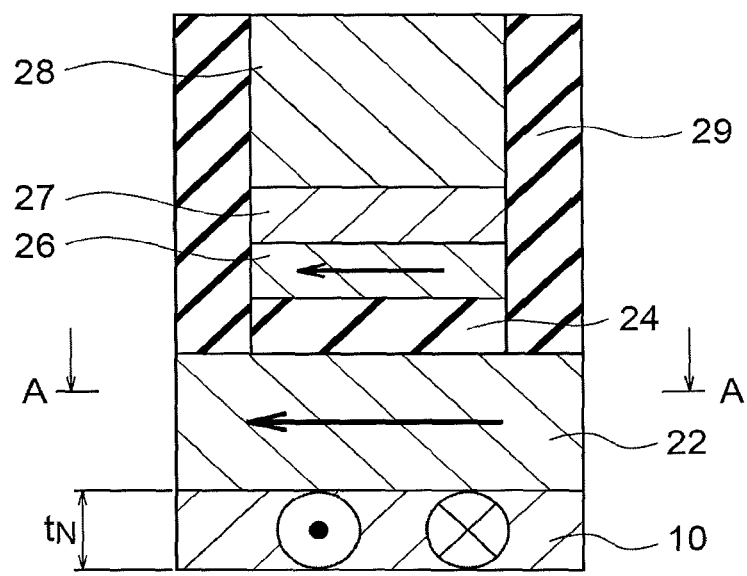
FIG. 23A is a cross-sectional view of a memory cell according to the fifth embodiment.
Figure 23B:
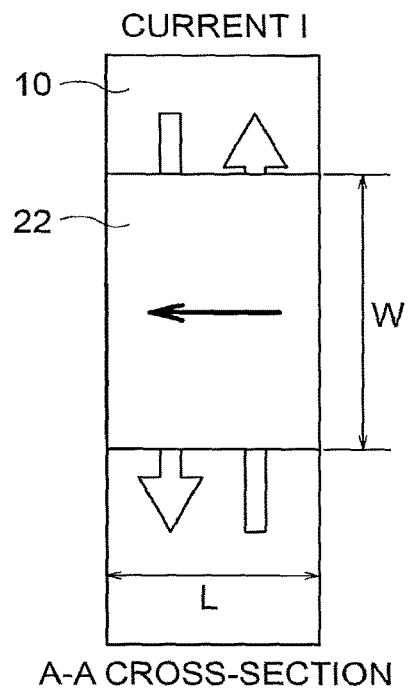
FIG. 23B is a diagram of the memory cell of the fifth embodiment, when viewed from the section line A-A.
Figure 23C:
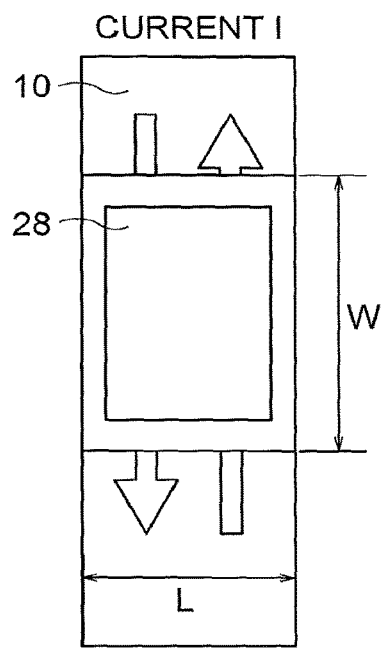
FIG. 23C is a top view of the memory cell according to the fifth embodiment.

As a magnetoresistive element having in-plane crystal magnetic anisotropy is used, it is possible to create a magnetoresistive element that has in-plane magnetization and has the short-side direction as its axis of easy magnetization (crystal magnetic anisotropy), as shown in FIGS. 23A, 23B, and 23C. With this structure, the write efficiency of the SOT-MRAM can be increased. FIG. 23A is a cross-sectional view of the memory cell. FIG. 23B shows the memory cell viewed from the section line A-A defined in FIG. 23A. FIG. 23C is a top view of the memory cell.

The memory retention energy ΔE of the magnetoresistive element is expressed as $$\Delta E = Ku \times L \times W \times t_{SL}.$$

Here, Ku represents the magnetic anisotropy energy of the storage layer 22, L represents the length of the storage layer 22, W represents the width of the storage layer 22, and $t_{SL}$ represents the thickness of the storage layer 22.

Meanwhile, the anisotropy field $H_{SL}$ of the storage layer 22 is expressed as $$H_{SL} = 2Ku/Ms.$$

Here, Ms represents the saturation magnetization of the storage layer 22.

Accordingly, the magnetic field $H_{SOT}$ generated by the nonmagnetic layer 10 is expressed as shown in $$H_{SOT} = \frac{\hbar \theta_{SH}}{2eM_s t_f \cdot t_N L} I.$$

Here, the condition for the magnetization of the storage layer 22 to be reversed by spin orbit torque (SOT) is $$H_{SOT} \geq H_{SL}.$$

Therefore, the inversion current is expressed as shown in $$I_c \geq 2Ku \frac{2e \times t_{SL} \times t_N \times L}{\hbar \theta_{SH}}.$$

Here, e represents the elementary charge, $t_N$ represents the thickness of the nonmagnetic layer 10, h-bar represents $h/(2\pi)$ where h represents the Planck constant, and $\theta_{SH}$ represents the spin Hall angle.

Accordingly, the write efficiency by the nonmagnetic layer 10 is expressed as $$\Delta E/I_c = W/(4e \times t_N).$$

That is, the greater the width W of the storage layer 22 becomes, the more the write efficiency increases. However, for the easy axis of the storage layer 22 having conventional in-plane magnetization using shape anisotropy to be oriented in a direction perpendicular to the wiring direction of the nonmagnetic layer 10, the width W needs to be made smaller than the wiring width L.

In a magnetoresistive element with in-plane crystal magnetic anisotropy, on the other hand, the easy axis is determined by the crystal direction of the base layer. Because of this, the direction of the length L of the storage layer can be the easy axis, even if W≥L. Thus, the write efficiency can be increased.

Figure 24:
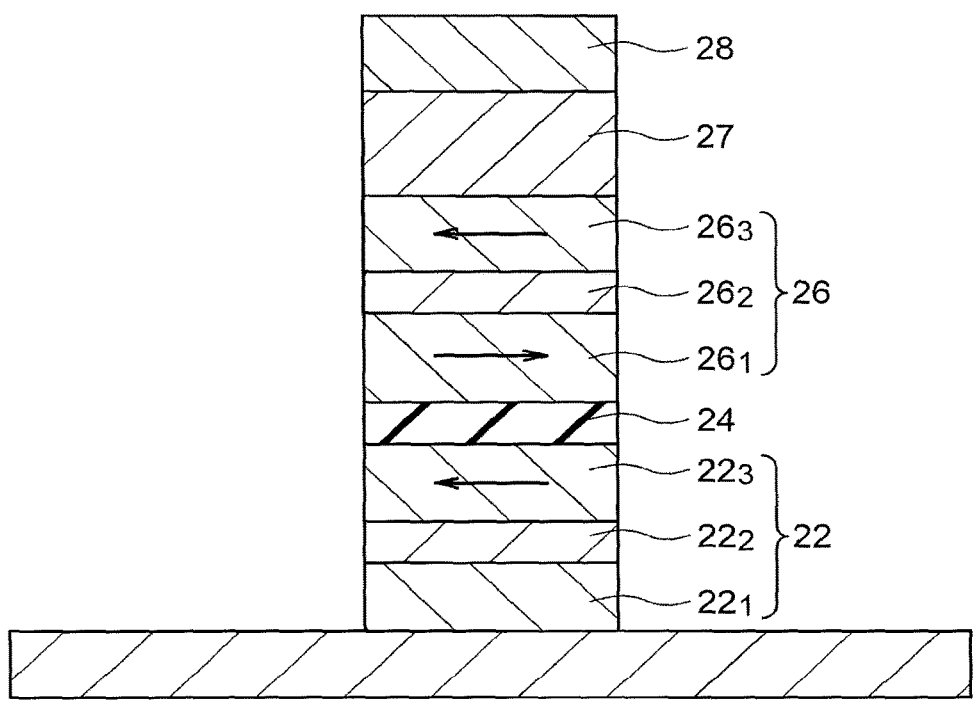
FIG. 24 is a cross-sectional view of a memory cell according to a modification of the fifth embodiment.

FIG. 24 shows a modification of a memory cell in which the storage layer 22 has an SAF structure. In the memory cell of this example, a layer of at least one element selected from the group consisting of Ta, W, Pt, Ru, Pd, Au, and Hf, a multilayer structure formed with layers of those elements, or an alloy containing at least one of those elements can be used as a nonmagnetic layer 10. In other words, the nonmagnetic layer 10 may include at least one element of Ta, W, Pt, Ru, Pd, Au, or Hf. As used herein, a phrase referring to "at least one of" a list of items refers to any combination of those items, including a single member. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, b-c-c, c-c, and c-c-c or any other ordering of a, b, and c)."

A multilayer structure 22 formed with a magnetic layer $22_1$, a Ru layer $22_2$, and a magnetic layer $22_3$ is formed as a storage layer 22 on the nonmagnetic layer 10. CoFe, CoFeB, or the like can be used as the magnetic layers $22_1$ and $22_3$. The thickness of the Ru layer $22_2$ is adjusted so that the magnetic layers on and under the Ru layer $22_2$ are coupled antiparallel to each other. A MgO layer 24 is formed on the film stack 22. Further, a reference layer 26 is formed, and an IrMn layer or a PtMn layer is formed as an antiferromagnetic layer 27. A Ta layer is formed as a cap layer 28 on the antiferromagnetic layer 27. The reference layer 26 may also be an SAF structure formed with a magnetic layer $26_1$, a Ru layer $26_2$, and a magnetic layer $26_3$. CoFe or CoFeB is used as the magnetic layers $26_1$ and $26_3$. After the film formation, annealing is performed at 300 degrees centigrade for one hour, while a magnetic field is applied in such as direction as to pin the magnetization of the reference layer 26. In this manner, the magnetization of the magnetic layers in the reference layer 26 is coupled to the antiferromagnetic layer 27. In the storage layer 22 including an SAF structure, the magnetization of the magnetic layer $22_1$ adjacent to the nonmagnetic layer 10 is switched by spin orbit torque (SOT), so that the magnetization of the coupled magnetic layer $22_3$ on the opposite side is also switched. Thus, a large retention energy can be maintained more effectively than in a storage layer having a single magnetic layer.

Sixth Embodiment

Figure 25:
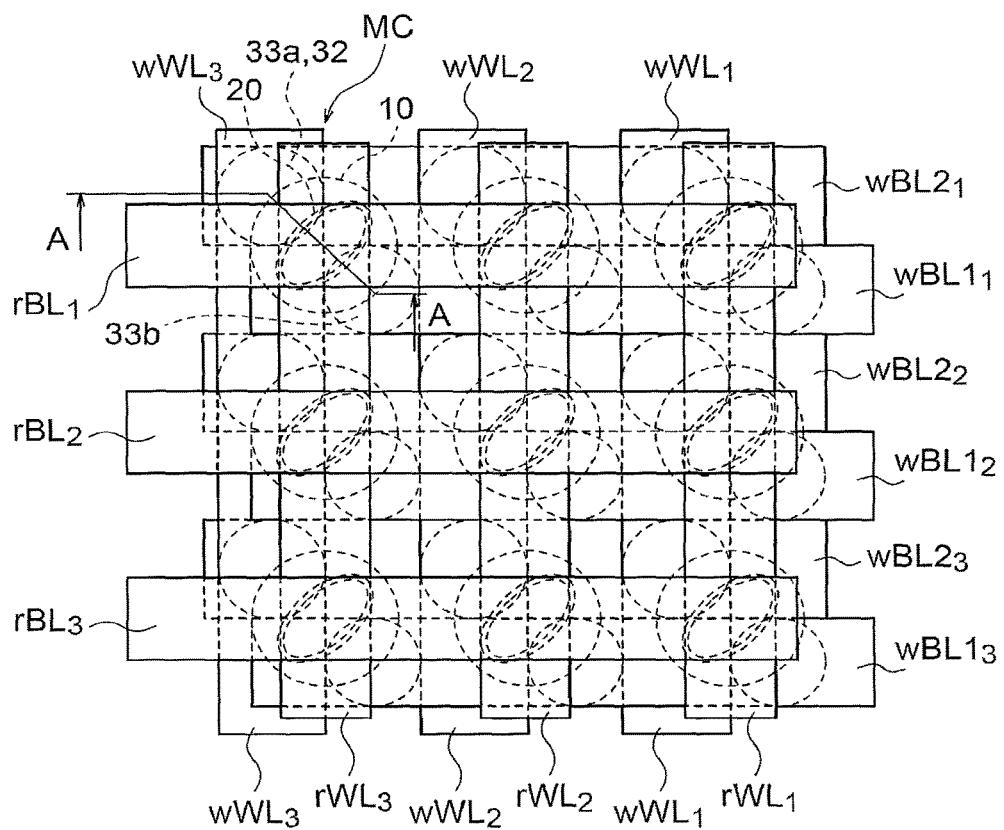
FIG. 25 is a top view of a magnetic memory according to a sixth embodiment.
Figure 26:
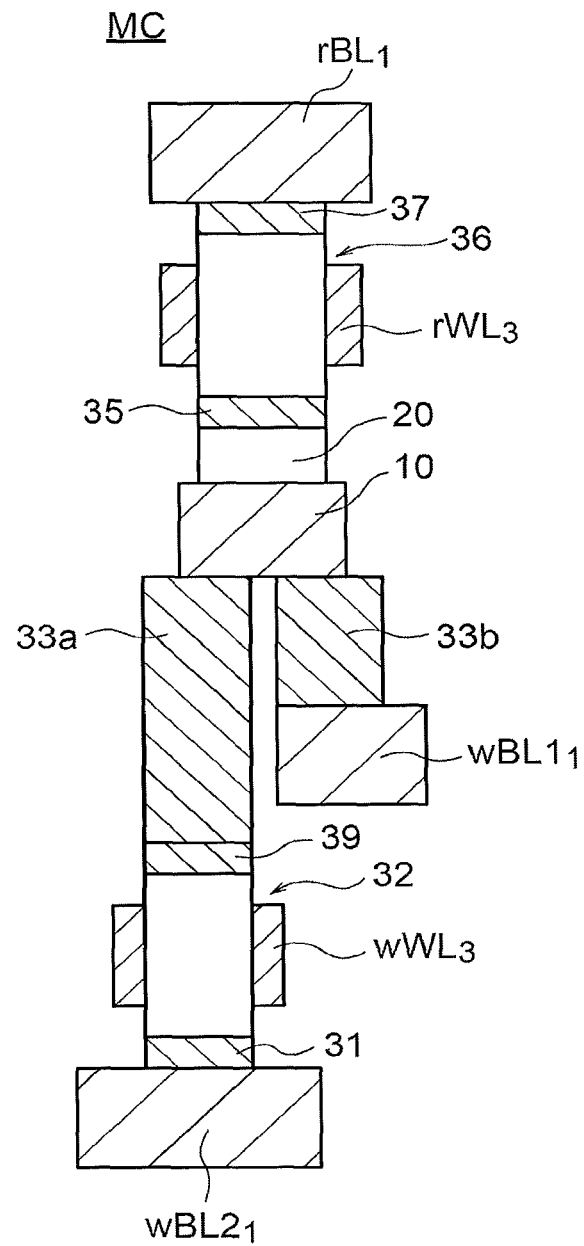
FIG. 26 is a cross-sectional view of a memory cell of the magnetic memory according to the sixth embodiment.

Referring now to FIGS. 25 and 26, a magnetic memory according to a sixth embodiment is described. FIG. 25 is a plan view of the magnetic memory of the sixth embodiment. FIG. 26 is a cross-sectional view taken along the section line A-A defined in FIG. 25.

The magnetic memory of the sixth embodiment includes memory cells MC, and each of the memory cells MC includes a write transistor 32, a nonmagnetic layer 10, a magnetoresistive element 20, and a read transistor 36. The nonmagnetic layer 10 of each memory cell MC is electrically insulated from the nonmagnetic layers 10 of the other memory cells MC. FIG. 26 is a cross-sectional view of one memory cell.

As shown in FIG. 25, the magnetic memory of the sixth embodiment includes first write bit lines $wBL1_i$ (i=1, . . . ) that are separated from one another and are arranged in parallel in the transverse direction of the drawing, and second write bit lines $wBL2_j$ (j=1, . . . ) that are separated from one another and are arranged in parallel in the transverse direction. In this embodiment, the first write bit lines $wBL1_i$ (i=1, . . . ) are provided at the same level. The second write bit lines $wBL2_j$ (j=1, . . . ) are disposed at a higher level than the level at which the first write bit lines $wBL1_i$ (i=1, . . . ) are disposed.

When the magnetic memory of the sixth embodiment is viewed from above, the first write bit lines $wBL1_i$ (i=1, . . . ) and the second write bit lines $wBL2_j$ (j=1, . . . ) are alternately arranged and are in contact with each other, as shown in FIG. 25. Specifically, the second write bit line $wBL2_1$, the first write bit line $wBL1_1$, the second write bit line $wBL2_2$, the first write bit line $wBL1_2$, the second write bit line $wBL2_3$, and the first write bit line $wBL1_3$ are arranged in this order from the top of the drawing, and are in contact with one another.

In the magnetic memory of the sixth embodiment, read bit lines $rBL_k$ (k=1, . . . ) are provided at a higher level than the level at which the first write bit lines $wBL1_i$ (i=1, . . . ) are disposed. The read bit lines $rBL_k$ are separated from one another and are arranged in parallel in the transverse direction of FIG. 25. When the magnetic memory of the sixth embodiment is viewed from above, the read bit lines $rBL_k$ (k=1, . . . ) are arranged so as to partially overlap with the second write bit lines $wBL2_k$ and the first write bit lines $WBL1_k$, respectively, as shown in FIG. 25

The magnetic memory of the sixth embodiment further includes write word lines $wWL_m$ (m=1, . . . ) that are separated from one another and are arranged in parallel in the longitudinal direction of the drawing, and read word lines $rWL_n$ (n=1, . . . ) that are separated from one another and are arranged in parallel in the longitudinal direction. The read word lines $rWL_n$ (n=1, . . . ) are provided at a higher level than the write word lines $WWL_m$ (m=1, . . . ). When the magnetic memory of the sixth embodiment is viewed from above, the read word lines $rWL_n$ (n=1, . . . ) are arranged so as to partially overlap with the write word lines $wWL_k$, as shown in FIG. 25.

Vertical write transistors 32 corresponding to the respective memory cells are disposed in the cross regions between the second write bit lines $wBL2_i$ (i=1, . . . ) and the write word lines $wWL_j$ (j=1, . . . ) (FIG. 26). As shown in FIG. 26, the source or drain of the write transistor 32, or the source of the write transistor 32, for example, is connected to the corresponding second write bit line wBL2$_1$ via a conductive layer 31, and the drain is connected to the corresponding nonmagnetic layer 10 via a conductive layer 39 and a conductive layer 33a. Also, the gate electrode of the write transistor 32 is connected to the corresponding write word line wWL$_3$. In this embodiment, the nonmagnetic layers 10 are circular in planar shape, as shown in FIG. 25.

As shown in FIG. 26, in each memory cell, the nonmagnetic layer 10 is connected to the first write bit line wBL1$_1$ via a conductive layer 33b. The first write bit line wBL1$_1$ partially overlaps with the corresponding second write bit line wBL2$_1$. A magnetoresistive element 20 is disposed on each nonmagnetic layer 10. As shown in FIG. 25, the magnetoresistive elements 20 are elliptical in planar shape. As shown in FIG. 25, the conductive layers 33a and the conductive layers 33b are arranged at a distance from each other in the short-axis direction of the elliptical shape of the magnetoresistive elements 20.

Also, vertical read transistors 36 corresponding to the respective memory cells are disposed in the cross regions between the read bit lines rBL$_i$ (i=1, . . . ) and the read word lines rWL$_j$ (j=1, . . . ). As shown in FIG. 26, the gate electrode of the read transistor 36 is connected to the corresponding read word line rWL$_3$. The source or the drain of the read transistor 36, or the source of the read transistor 36, for example, is connected to the magnetoresistive element 20 via a conductive layer 35, and the drain is connected to the corresponding read bit line rBL$_1$ via a conductive layer 37.

In the magnetic memory of the sixth embodiment designed as above, vertical MOS transistors are used as the write transistors and the read transistors. Thus, an increase in the area occupied by memory cells can be prevented.

(Write Method)

Figure 27:
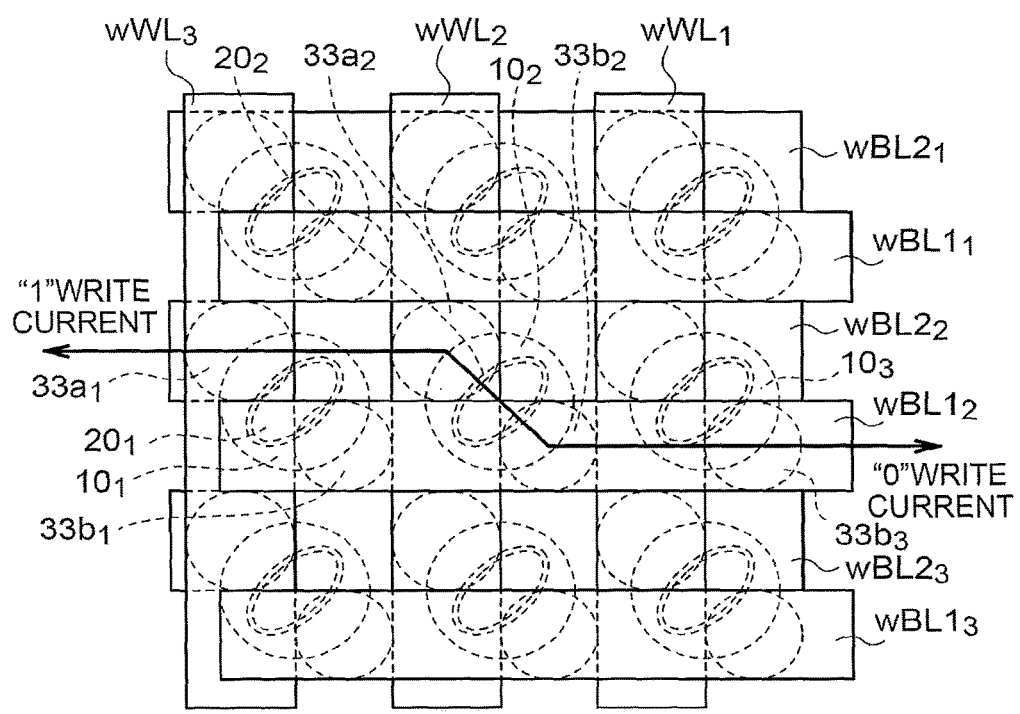
FIG. 27 is a top view for explaining a method of writing in the magnetic memory according to the sixth embodiment.
Figure 28:
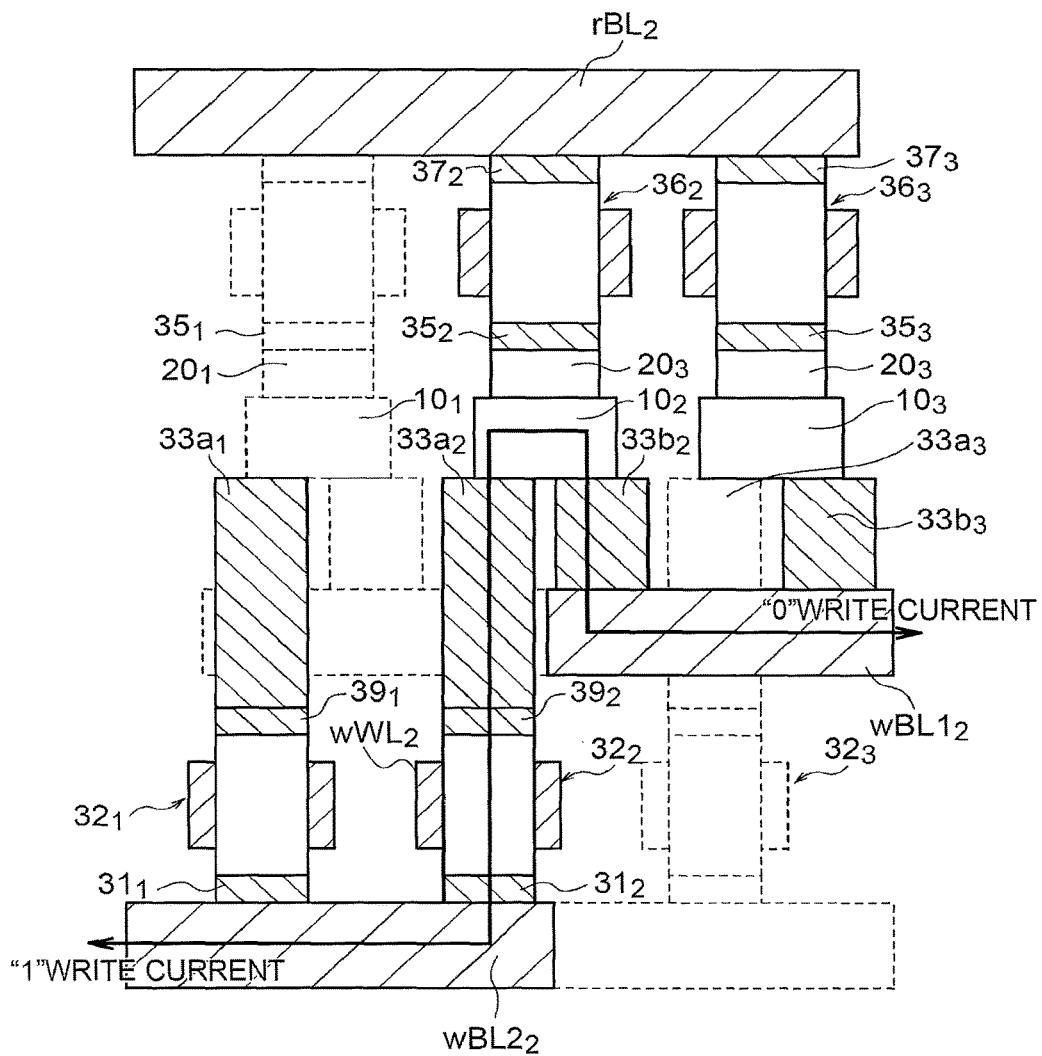
FIG. 28 is a cross-sectional view for explaining the method of writing in the magnetic memory according to the sixth embodiment.

Referring now to FIGS. 27 and 28, a write method in the magnetic memory of the sixth embodiment is described. FIG. 27 is a top view of the magnetic memory of the sixth embodiment. FIG. 28 is a cross-sectional view taken along the later described write currents indicated by arrows in FIG. 27 and along a plane perpendicular to the drawing. An example case where writing is performed on the magnetoresistive element 20$_2$ shown in FIG. 27 is described below.

First, the write transistor 32$_2$ in the memory cell to which the magnetoresistive element 20$_2$ belongs is switched on. This is carried out by applying voltage to the write word line wWL$_2$. A potential gradient is then caused between the first write bit line wBL1$_2$ and the second write bit line wBL2$_2$, which are connected to the magnetoresistive element 20$_2$. As a result, a write current indicated by an arrow flows between the first write bit line wBL1$_2$ and the second write bit line wBL2$_2$ via the conductive layer 31$_2$, the write transistor 32$_2$, the conductive layer 33a$_2$, the nonmagnetic layer 10$_2$, and the conductive layer 33b$_2$. In this manner, writing is performed on the magnetoresistive element 20$_2$ connected to the nonmagnetic layer 10$_2$. Where the potential of the second write bit line wBL2$_2$ is made higher than the potential of the first write bit line wBL1$_2$, for example, the write current for data "0" flows through the second write bit line wBL2$_2$, the conductive layer 31$_2$, the write transistor 32$_2$, the conductive layer 39$_2$, the conductive layer 33a$_2$, the nonmagnetic layer 10$_2$, the conductive layer 33b$_2$, and the first write bit line wBL1$_2$, in this order. If the potential gradient is reversed, for example, the write current for data "1" flows through the first write bit line wBL1$_2$, the conductive layer 33b$_2$, the nonmagnetic layer 10$_2$, the conductive layer 33a$_2$, the conductive layer 39$_2$, the write transistor 32$_2$, the conductive layer 31$_2$, and the second write bit line wBL2$_2$, in this order.

In this manner, writing can be performed.

(Read Method)

Figure 29:
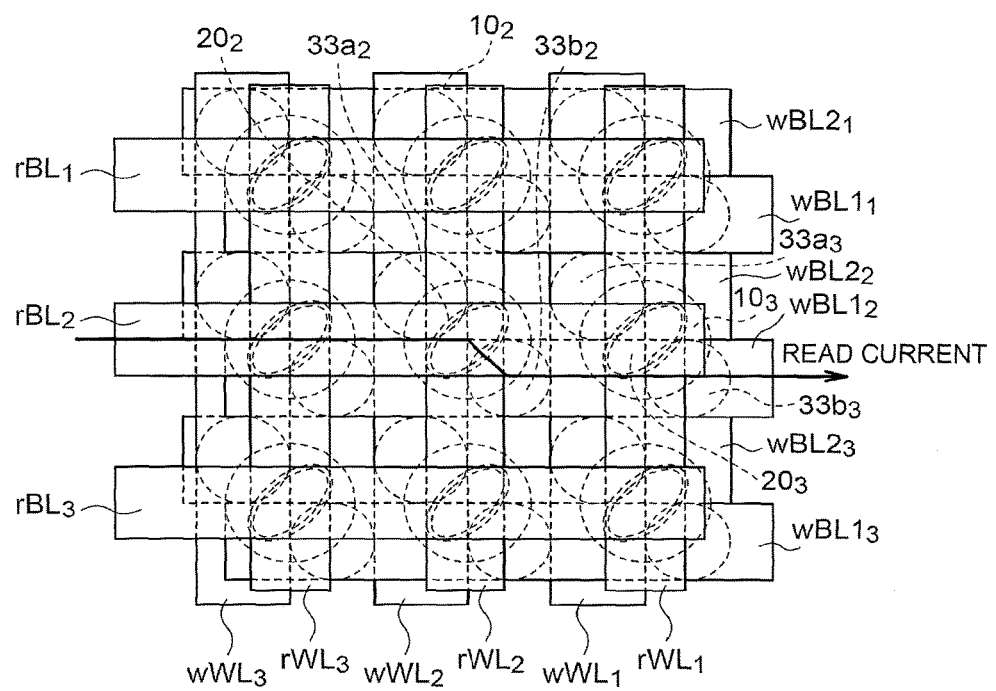
FIG. 29 is a top view for explaining a method of reading from the magnetic memory according to the sixth embodiment.
Figure 30:
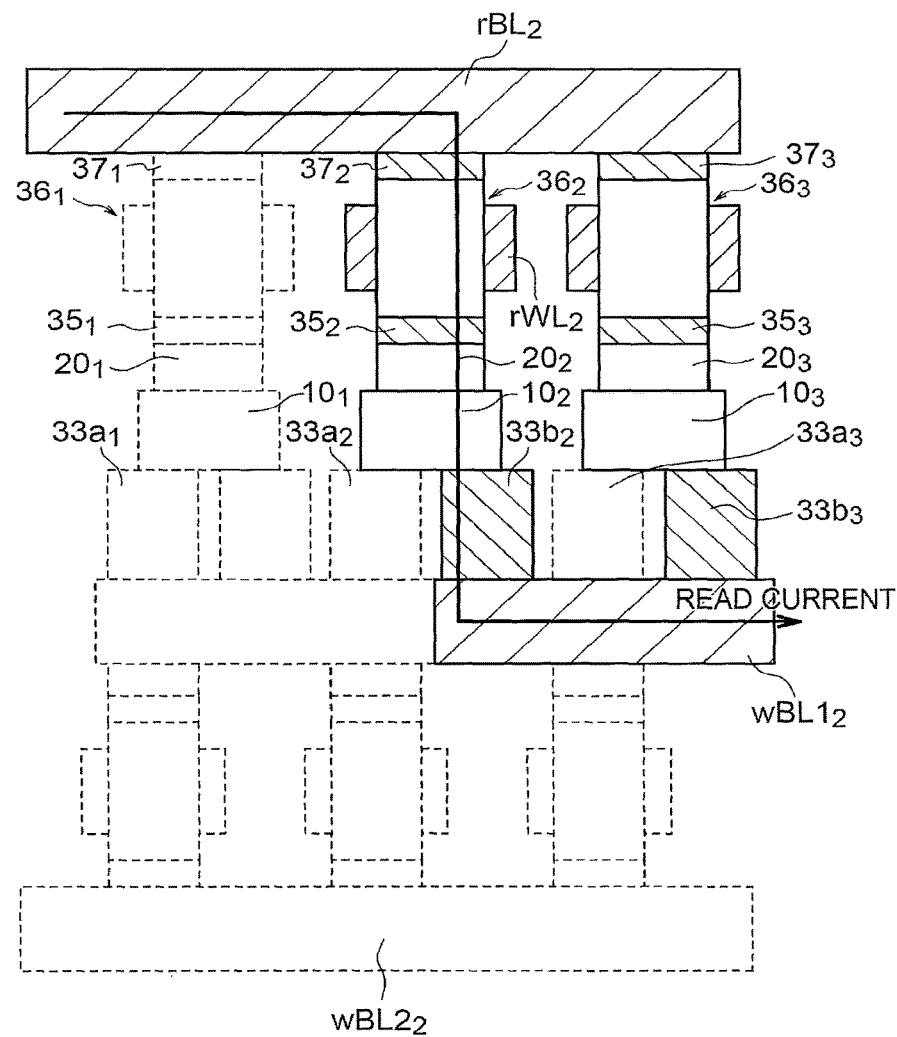
FIG. 30 is a cross-sectional view for explaining the method of reading from the magnetic memory according to the fourth embodiment.

Referring now to FIGS. 29 and 30, a read method in the magnetic memory of the sixth embodiment is described. FIG. 29 is a top view of the magnetic memory of the sixth embodiment. FIG. 30 is a cross-sectional view taken along the later described read current indicated by an arrow in FIG. 29 and along a plane perpendicular to the drawing. An example case where reading is performed on the magnetoresistive element 20$_2$ shown in FIG. 29 is described below.

First, the read transistor 36$_2$ in the memory cell to which the magnetoresistive element 20$_2$ belongs is switched on. This is carried out by applying voltage to the read word line rWL$_2$. A potential gradient is then caused between the read bit line rBL$_2$ and the first write bit line wBL1$_2$, which are connected to the magnetoresistive element 20$_2$. Where the potential of the read bit line rBL$_2$ is made higher than the potential of the first write bit line wBL1$_2$, for example, the read current indicated by the arrow flows through the read bit line rBL$_2$, the conductive layer 37$_2$, the read transistor 36$_2$, the conductive layer 35$_2$, the magnetoresistive element 20$_2$, the nonmagnetic layer 10$_2$, the conductive layer 33b$_2$, and the first write bit line wBL1$_2$, in this order. At this point, the voltage between the read bit line rBL$_2$ and the first write bit line wBL1$_2$ is measured. In this manner, the resistance state of the magnetoresistive element 20$_2$ can be read.

In the sixth embodiment, vertical read transistors are disposed on the opposite side of the magnetoresistive elements from the Si substrate on which the second write bit lines are provided. In this case, a high-temperature annealing process at approximately 700 degrees centigrade is normally required in the process of manufacturing the vertical read transistors. However, the upper temperature limit of a magnetoresistive element is normally 400 degrees centigrade or lower, and therefore, the characteristics of the magnetoresistive elements might be degraded by the high-temperature annealing process. To avoid that, the vertical transistors to be provided on the opposite side of the magnetoresistive elements from the Si substrate may be manufactured by using the board bonding process described above with reference to FIGS. 22A and 22B.

Specifically, polysilicon film formation and the annealing process are performed on a different wafer from the Si wafer on which the film formation for the magnetoresistive elements is performed. After that, the board bonding process is performed, to bond the wafer to the Si wafer having the magnetoresistive elements mounted thereon. The vertical transistors may be manufactured in this manner.

In the sixth embodiment, one write transistor is disposed for one memory cell. In the first through fifth embodiments, one write transistor, instead of two write transistors, may be disposed for one memory cell, as in the sixth embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
a first nonmagnetic layer including a first face and a second face opposed to the first face, the first face including a first region, a second region, and a third region between the first region and the second region, the second face including a fourth region opposed to the first region, a fifth region opposed to the second region, and a sixth region between the fourth region and the fifth region, and the sixth region being opposed to the third region, the first nonmagnetic layer being conductive;
a first and second wirings disposed on a side of the first face of the first nonmagnetic layer, and intersecting with the first nonmagnetic layer respectively;
a third wiring disposed on a side of the second face of the first nonmagnetic layer;
a first transistor disposed between the first wiring and the first region of the first nonmagnetic layer, the first transistor including a source and a drain, one of the source and the drain being electrically connected to the first wiring, the other one being electrically connected to the first region of the first nonmagnetic layer;
a second transistor disposed between the second wiring and the second region of the first nonmagnetic layer, the second transistor including a source and a drain, one of the source and the drain being electrically connected to the second wiring, the other one being electrically connected to the second region of the first nonmagnetic layer;
a magnetoresistive element disposed between the sixth region of the first nonmagnetic layer and the third wiring, the magnetoresistive element including a first terminal and a second terminal, the first terminal being electrically connected to the sixth region of the first nonmagnetic layer; and
a third transistor including a source and a drain, one of the source and the drain being electrically connected to the second terminal, the other one being electrically connected to the third wiring.

2. The memory according to claim 1, wherein the third wiring extends in a direction in which the first and second wirings extend.

3. The memory according to claim 1, wherein the third wiring extends in a direction in which the first nonmagnetic layer extends.

4. The memory according to claim 1, wherein the first through third transistors are vertical transistors.

5. A magnetic memory comprising:
a first wiring and a second wiring arranged at a distance from each other, the first and second wirings extending in a first direction;
a third wiring;
a first nonmagnetic layer disposed between the third wiring and the first and second wirings, the first nonmagnetic layer being conductive, the first nonmagnetic layer including a first face and a second face opposed to the first face, the first face including a first region, a second region, and a third region between the first region and the second region, the second face including a fourth region opposed to the first region, a fifth region opposed to the second region, and a sixth region between the fourth region and the fifth region, and the sixth region being opposed to the third region, the first region being located to correspond to the first wiring, the second region being located correspond to the second wiring;
a first transistor disposed between the first wiring and the first region of the first nonmagnetic layer, the first transistor including a source and a drain, one of the source and the drain being electrically connected to the first wiring, the other one being electrically connected to the first region of the first nonmagnetic layer;
a magnetoresistive element disposed between the sixth region of the first nonmagnetic layer and the third wiring, the magnetoresistive element including a first terminal and a second terminal, the first terminal being electrically connected to the sixth region of the first nonmagnetic layer; and
a second transistor including a source and a drain, one of the source and the drain being electrically connected to the second terminal of the magnetoresistive element, the other one being electrically connected to the third wiring.

6. The memory according to claim 5, further comprising
a third transistor disposed between the second wiring and the second region of the first nonmagnetic layer, wherein
one of a source and a drain of the third transistor is electrically connected to the second wiring, the other one of the source and the drain of the third transistor being electrically connected to the second region of the first nonmagnetic layer.

7. The memory according to claim 6, wherein the first through third transistors are vertical transistors.

8. The memory according to claim 6, further comprising
a fourth wiring electrically connected to a gate of the first transistor and a gate of the third transistor.

9. The memory according to claim 8, further comprising
a fifth wiring electrically connected to a gate of the second transistor, wherein
the fourth and fifth wirings extend in a second direction intersecting with the first direction, and
the first nonmagnetic layer extends in the second direction.

10. The memory according to claim 1, wherein
the magnetoresistive element is elliptical in planar shape.

11. A magnetic memory comprising:
a plurality of first wirings arranged at a distance from each other at a first level, the first wirings extending in a first direction, the first level including a first plane extending in the first direction and a second direction intersecting with the first direction;
a plurality of second wirings arranged at a distance from each other at the first level;
a plurality of third wirings arranged at a distance from each other at a second level, the third wirings extending in the first direction, the second level including a second plane extending in the first direction and the second direction, the second plane being located at a position different from that of the first plane in a third direction intersecting with the first plane;
a plurality of first nonmagnetic layers arranged at a distance from each other at a third level between the first level and the second level, the first nonmagnetic layers being conductive, each of the first nonmagnetic layers intersecting with the first wirings and the third wirings, each of the first nonmagnetic layers including a first face and a second face opposed to the first face, the first face including a first region, a second region, and a third region between the first region and the second region, the second face including a fourth region opposed to the first region, a fifth region opposed to the second region, and a sixth region between the fourth region and the fifth region, the sixth region being opposed to the third region, the first region being located to correspond to one of the first wirings, the second region being located to correspond to one of the second wirings;

a plurality of fourth wirings arranged at a distance from each other between the first level and the third level, the fourth wirings extending in the second direction;

a plurality of fifth wirings arranged at a distance from each other between the third level and the second level, the fifth wirings extending in the second direction;

a plurality of first transistors disposed in cross regions between the first nonmagnetic layers and the first wirings, each of the first transistors being located between the first region of corresponding one of the nonmagnetic layers and corresponding one of the first wirings, one of a source and a drain of each of the first transistors being electrically connected to corresponding one of the first wirings, the other one of the source and the drain of each of the first transistors being electrically connected to the first region of corresponding one of the first nonmagnetic layers, a gate electrode of each of the first transistors being electrically connected to one of the fourth wirings;

a plurality of second transistors disposed in cross regions between the first nonmagnetic layers and the second wirings, each of the second transistors being located between the second region of corresponding one of the nonmagnetic layers and corresponding one of the second wirings, one of a source and a drain of each of the second transistors being electrically connected to corresponding one of the second wirings, the other one of the source and the drain of each of the second transistors being electrically connected to the second region of corresponding one of the first nonmagnetic layers, a gate electrode of each of the second transistors being electrically connected to one of the fourth wirings;

a plurality of magnetoresistive elements disposed in cross regions between the first nonmagnetic layers and the third wirings, each of the magnetoresistive elements being located on the sixth region of corresponding one of the first nonmagnetic layers, each of the magnetoresistive elements including a first terminal and a second terminal, the first terminal being electrically connected to the sixth region of corresponding one of the first nonmagnetic layers; and a plurality of third transistors corresponding to the magnetoresistive elements, one of a source and a drain of each of the third transistors being electrically connected to the second terminal of corresponding one of the magnetoresistive elements, the other one of the source and the drain of each of the third transistors being electrically connected to corresponding one of the third wirings, a gate electrode of each of the third transistors being electrically connected to one of the fifth wirings.

12. The memory according to claim 11, wherein the first, second, and third transistors are vertical transistors.

13. A magnetic memory comprising:

a plurality of first wirings arranged at a distance from each other at a first level, the first wirings extending in a first direction, the first level including a first plane extending in the first direction and a second direction intersecting with the first direction;

a plurality of second wirings arranged at a distance from each other at a second level, the second wirings extending in the second direction, the second level including a second plane extending in the first direction and the second direction, the second plane being located at a position different from that of the first plane in a third direction intersecting with the first plane;

a plurality of first nonmagnetic layers arranged at a distance from each other at a third level between the first level and the second level, the first nonmagnetic layers extending in the second direction and being conductive, each of the first nonmagnetic layers corresponding to one of the second wirings;

a plurality of third wirings arranged at a distance from each other at a fourth level between the first level and the third level, the third wirings extending in the first direction;

a plurality of fourth wirings arranged at a distance from each other between the first level and the fourth level, the fourth wirings extending in a fourth direction intersecting with the first direction and the second direction;

a plurality of fifth wirings arranged at a distance from each other between the third level and the fourth level, the fifth wirings extending in the fourth direction;

a plurality of sixth wirings arranged at a distance from each other between the second level and the third level, the sixth wirings extending in a fifth direction intersecting with the second direction;

a plurality of first transistors disposed in cross regions between the first nonmagnetic layers and the third wirings, one of a source and a drain of each of the first transistors being electrically connected to corresponding one of the third wirings, the other one of the source and the drain of each of the first transistors being electrically connected to corresponding one of the first nonmagnetic layers, a gate electrode of each of the first transistors being electrically connected to one of the fifth wirings;

a plurality of second transistors disposed in cross regions between the first wirings and the first nonmagnetic layers, one of a source and a drain of each of the second transistors being electrically connected to corresponding one of first wirings, the other one of the source and the drain of each of the second transistors being electrically connected to corresponding one of the first nonmagnetic layers, a gate electrode of each of the second transistors being electrically connected to one of the fourth wirings;

a plurality of magnetoresistive elements disposed between the first nonmagnetic layers and the second wirings, each of the magnetoresistive elements including a first terminal and a second terminal, the first terminal being electrically connected to corresponding one of the first nonmagnetic layers; and a plurality of third transistors corresponding to the magnetoresistive elements, one of a source and a drain of each of the third transistors being electrically connected to the second terminal of corresponding one of the magnetoresistive elements, the other one of the source and the drain of each of the third transistors being electrically connected to corresponding one of the second wirings, a gate electrode of each of the third transistors being electrically connected to one of the sixth wirings.

14. The memory according to claim 13, wherein the first through third transistors are vertical transistors.

15. A magnetic memory comprising:

a plurality of first wirings arranged at a distance from each other at a first level, the first wirings extending in a first direction, the first level including a first plane extending in the first direction and a second direction intersecting with the first direction;
a plurality of second wirings arranged at a distance from each other at a second level, the second wirings extending in the first direction, the second level including a second plane extending in the first direction and the second direction, the second plane being located at a position different from that of the first plane in a third direction intersecting with the first plane;
a plurality of first nonmagnetic layers arranged at a distance from each other at a third level between the first level and the second level, the first nonmagnetic layers extending in the second direction, the first nonmagnetic layers being conductive;
a plurality of third wirings arranged at a distance from each other at a fourth level between the first level and the third level, the third wirings extending in the first direction;
a plurality of fourth wirings arranged at a distance from each other at a fifth level between the second level and the third level, the fourth wirings extending in the first direction;
a plurality of fifth wirings arranged at a distance from each other between the first level and the fourth level, the fifth wirings extending in a fourth direction intersecting with the first direction and the second direction;
a plurality of sixth wirings arranged at a distance from each other between the third level and the fourth level, the sixth wirings extending in the fourth direction;
a plurality of seventh wirings arranged at a distance from each other between the second level and the third level, the seventh wirings extending in the fourth direction;
a plurality of eighth wirings arranged at a distance from each other between the third level and the fifth level, the eighth wirings extending in the fourth direction;
a plurality of first transistors disposed in cross regions between the first nonmagnetic layers and the third wirings, one of a source and a drain of each of the first transistors being electrically connected to corresponding one of the third wirings, the other one of the source and the drain of each of the first transistors being electrically connected to corresponding one of the first nonmagnetic layers, a gate electrode of each of the first transistors being electrically connected to one of the sixth wirings;
a plurality of second transistors disposed in cross regions between the first wirings and the first nonmagnetic layers, one of a source and a drain of each of the second transistors being electrically connected to corresponding one of the first wirings, the other one of the source and the drain of each of the second transistors being electrically connected to corresponding one of the first nonmagnetic layers, a gate electrode of each of the second transistors being electrically connected to one of the fifth wirings;
a plurality of first magnetoresistive elements disposed in cross regions between the first nonmagnetic layers and the second wirings, each of the first magnetoresistive elements including a first terminal and a second terminal, the first terminal being electrically connected to corresponding one of the first nonmagnetic layers;
a plurality of third transistors corresponding to the first magnetoresistive elements, one of a source and a drain of each of the third transistors being electrically connected to the second terminal of corresponding one of the first magnetoresistive elements, the other one of the source and the drain of each of the third transistors being electrically connected to corresponding one of the second wirings, a gate electrode of each of the third transistors being electrically connected to one of the seventh wirings;
a plurality of second magnetoresistive elements disposed in cross regions between the first nonmagnetic layers and the fourth wirings, each of the second magnetoresistive elements including a first terminal and a second terminal, the first terminal being electrically connected to corresponding one of the first nonmagnetic layers; and
a plurality of fourth transistors corresponding to the second magnetoresistive elements, one of a source and a drain of each of the fourth transistors being electrically connected to the second terminal of corresponding one of the second magnetoresistive elements, the other one of the source and the drain of each of the fourth transistors being electrically connected to corresponding one of the fourth wirings, a gate electrode of each of the fourth transistors being electrically connected to one of the eighth wirings.

16. The memory according to claim 15, wherein the first through fourth transistors are vertical transistors.

17. The memory according to claim 1, wherein the magnetoresistive element includes a first magnetic layer, a second magnetic layer disposed between the first magnetic layer and the first nonmagnetic layer, and a second nonmagnetic layer disposed between the first magnetic layer and the second magnetic layer.

18. The memory according to claim 17, wherein the second magnetic layer has a magnetization direction intersecting with a direction from the first magnetic layer toward the second magnetic layer.

19. The memory according to claim 1, wherein the first nonmagnetic layer contains at least one element of Pt, Pd, Au, Ru, W, Hf, or Ta.

20. The memory according to claim 17, wherein the second magnetic layer contains at least one element of Fe, Co, or Mn, and at least one element of Pt, Pd, Au, Ru, Ga, or Ge.

21. The memory according to claim 17, wherein the second magnetic layer has an axis of easy magnetization in a short-side direction.

22. The memory according to claim 17, wherein when a write current flow between the first wiring and the second wiring through the first nonmagnetic layer, a magnetization direction of the second magnetic layer is changeable.

23. The memory according to claim 5, wherein the magnetoresistive element includes a first magnetic layer, a second magnetic layer disposed between the first magnetic layer and the first nonmagnetic layer, and a second nonmagnetic layer disposed between the first magnetic layer and the second magnetic layer.

24. The memory according to claim 23, wherein when a write current flow between the first wiring and the second wiring through the first nonmagnetic layer, a magnetization direction of the second magnetic layer is changeable.

25. The memory according to claim 11, wherein the magnetoresistive elements include a first magnetic layer, a second magnetic layer disposed between the first magnetic layer and the first nonmagnetic layer, and a second nonmagnetic layer disposed between the first magnetic layer and the second magnetic layer respectively.

26. The memory according to claim 25, wherein when one of the magnetoresistive elements is written to flow a write current between corresponding one of the first wirings and corresponding one of the second wirings through corresponding one of the first nonmagnetic layers, a magnetization direction of the second magnetic layer of the one of the magnetoresistive elements is changeable.

* * * * *